United States Patent
Kim et al.

(10) Patent No.: US 9,443,735 B2
(45) Date of Patent: Sep. 13, 2016

(54) METHOD OF MANUFACTURING SEMICONDUCTOR DEVICE

(71) Applicant: Samsung Electronics Co., Ltd., Suwon-si (KR)

(72) Inventors: Jin Soak Kim, Seoul (KR); Gab Jin Nam, Seoul (KR); Dong Hwan Kim, Suwon-si (KR); Su Hwan Kim, Seoul (KR); Toshiro Nakanishi, Seongnam-si (KR); Sung Kweon Baek, Hwaseong-si (KR); Tae Hyun An, Seoul (KR); Eun Ae Chung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/444,037

(22) Filed: Jul. 28, 2014

(65) Prior Publication Data

US 2015/0132937 A1 May 14, 2015

(30) Foreign Application Priority Data

Nov. 12, 2013 (KR) ........................ 10-2013-0137235

(51) Int. Cl.
| | |
|---|---|
| H01L 21/336 | (2006.01) |
| H01L 21/762 | (2006.01) |
| H01L 21/28 | (2006.01) |
| H01L 29/51 | (2006.01) |
| H01L 29/66 | (2006.01) |
| H01L 29/78 | (2006.01) |
| H01L 29/49 | (2006.01) |

(52) U.S. Cl.
CPC ....... H01L 21/28185 (2013.01); H01L 29/518 (2013.01); H01L 29/6659 (2013.01); H01L 29/66545 (2013.01); H01L 29/7833 (2013.01); H01L 29/495 (2013.01); H01L 29/4966 (2013.01)

(58) Field of Classification Search
None
See application file for complete search history.

(56) References Cited

U.S. PATENT DOCUMENTS

| | | |
|---|---|---|
| 2005/0074939 A1 | 4/2005 | Ho et al. |
| 2005/0199877 A1 | 9/2005 | Dip et al. |
| 2006/0105524 A1 | 5/2006 | Han et al. |
| 2006/0166435 A1 | 7/2006 | Teo et al. |
| 2007/0032025 A1* | 2/2007 | Brunco ............ H01L 21/28518 438/300 |
| 2007/0128846 A1 | 6/2007 | Choi et al. |
| 2008/0246077 A1 | 10/2008 | Park et al. |
| 2008/0268615 A1 | 10/2008 | Allibert et al. |
| 2009/0283822 A1 | 11/2009 | Hsieh et al. |
| 2011/0183493 A1 | 7/2011 | Daval et al. |
| 2013/0052813 A1 | 2/2013 | Yeh et al. |
| 2013/0056799 A1 | 3/2013 | Ishizu |
| 2013/0056805 A1 | 3/2013 | Anderson et al. |
| 2014/0273412 A1* | 9/2014 | Wu .................... H01L 21/0206 438/478 |

FOREIGN PATENT DOCUMENTS

| | | |
|---|---|---|
| KR | 10-2006-0077022 A | 7/2006 |
| KR | 10-2007-0064014 A | 6/2007 |
| KR | 10-2010-0028240 A | 3/2010 |
| KR | 10-2013-0039450 A | 4/2013 |

* cited by examiner

*Primary Examiner* — Pamela E Perkins
(74) *Attorney, Agent, or Firm* — Myers Bigel & Sibley, P.A.

(57) ABSTRACT

There is provided a method of manufacturing a semiconductor device including: preparing a semiconductor substrate having an active region; forming a dielectric layer for gate insulation on the active region; forming a curing layer with a material containing germanium (Ge) on the dielectric layer; heat-treating the curing layer; and removing the curing layer. The germanium-containing material may be silicon germanium (SiGe) or germanium (Ge).

11 Claims, 27 Drawing Sheets

METHOD OF MANUFACTURING SEMICONDUCTOR DEVICE

CROSS-REFERENCE TO RELATED APPLICATION

This application claims priority under 35 U.S.C. §119 to Korean Patent Application No. 10-2013-0137235, filed on Nov. 12, 2013, with the Korean Intellectual Property Office, the entire disclosure of which is incorporated herein by reference.

BACKGROUND

The present disclosure relates to a method of manufacturing a semiconductor device.

A dielectric material is widely used as a main ingredient in semiconductor devices. Recently, as semiconductor devices increasingly have a higher degree of integration, a high-k dielectric material is being advantageously used. However, such a dielectric material may have a problem due to chemical instability thereof. For example, a bulk trap of a dielectric material or an interface trap of the dielectric material with a different region may occur to degrade reliability of a semiconductor device. In particular, in case of a high-k dielectric material, a large amount of interface traps are generated due to undesired diffusion of an element (e.g., a transition element), significantly degrading reliability.

SUMMARY

An aspect of the present disclosure relates to a scheme for improving characteristics of a dielectric layer employed in a semiconductor device. An aspect of the present disclosure may also provide a semiconductor device having enhanced reliability by employing an improved dielectric layer.

According to an example embodiment, a method of manufacturing a semiconductor device may include: preparing a semiconductor substrate having an active region; forming a dielectric layer for gate insulation on the active region; forming a curing layer with a material containing germanium (Ge) on the dielectric layer; heat-treating the curing layer; and removing the curing layer.

The germanium-containing material may be silicon germanium (SiGe) or germanium (Ge). The germanium-containing material may be SiGe doped with a specific conductivity-type impurity.

The heat treating may be performed at a temperature ranging from 500° C. to 1,300° C.

The method may further include forming a protective capping layer on the dielectric layer before forming of the curing layer. In this case, in the process of removing the curing layer, at least a portion of the protective capping layer may be removed.

The protective capping layer may be a first electrode layer for a gate electrode. In this case, the method may further include forming a second electrode layer on the first electrode layer after removing of the curing layer.

After removing of the curing layer, a gate electrode may be formed on the dielectric layer.

At least one of the first and second electrode layers, and the gate electrode may include at least one material selected from the group consisting of polysilicon (poly-Si), titanium (Ti), TiN, tungsten (W), WSi, WN, TaN, lanthanum (La), aluminum (Al), and TiAlC.

The dielectric layer may include at least one material selected from the group consisting of a hafnium oxide film ($HfO_2$), a hafnium silicon oxide film (HfSiO), a hafnium silicon oxy-nitride film (HfSiON), a hafnium oxy-nitride film (HfON), a hafnium aluminum oxide film (HfAlO), a hafnium lanthanum oxide film (HfLaO), a zirconium oxide film ($ZrO_2$), a tantalum oxide film ($TaO_2$), a zirconium silicon oxide film (ZrSiO), a lanthanum oxide film ($La2O_3$), a praseodymium oxide film ($Pr_2O_3$), a dysprosium oxide film ($Dy_2O_3$), a barium strontium titanate (BST) oxide film ($Ba_xSr_{1-x}TiO_3$), and a lead zirconate titanate (PZT) oxide film ($Pb(Zr_xTi_{1-x}) O_3$).

According to an example embodiment, a method of manufacturing a semiconductor device may include: preparing a semiconductor substrate having an active region; forming a dielectric layer for gate insulation on the active region; forming a curing layer with germanium (Ge) or silicon germanium (SiGe) on the dielectric layer; and heat-treating the curing layer to allow the germanium element to be diffused to the dielectric layer.

The method may further include forming a gate electrode on the dielectric layer before forming of the curing layer.

The method may further include: removing the curing layer after heat-treating the curing layer; and forming a gate electrode layer on the dielectric layer.

According to an example embodiment, a semiconductor device may include: a semiconductor substrate having an active region; a gate dielectric layer disposed on the active region; and a gate electrode disposed on the gate dielectric layer, wherein a germanium (Ge) element exists in at least one of the interior of the gate dielectric layer and interface between the dielectric layer and the active region, and trap concentration $N_{it}$ in the interface may be less than or equal to $3 \times 10^{11}/cm^2$.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
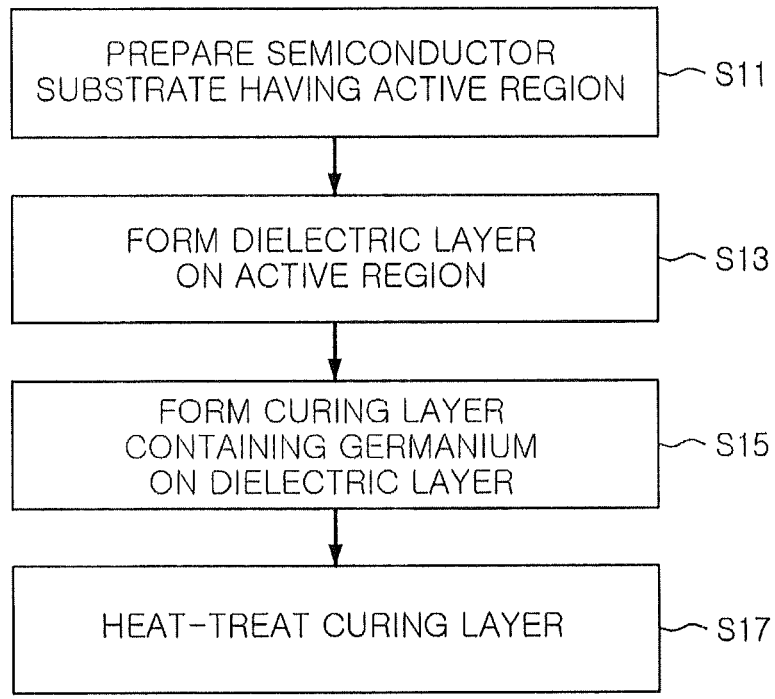
FIG. 1 is a flow chart illustrating a method of forming a dielectric layer according to an example embodiment of the present disclosure.

Hereinafter, example embodiments of the present disclosure will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Meanwhile, in the present disclosure, the term "one example" does not refer to the same example and each use of "one example" is provided to emphatically describe mutually different unique features. However, the examples proposed in the below description are not excluded from being combined with features of a different example so as to be implemented. For example, even though a matter described in a specific example is not described in a different example, the matter may be understood as descriptions related to the different example, unless otherwise mentioned in the different example.

FIG. 1 is a flow chart illustrating a method of forming a dielectric layer according to an example embodiment of the present disclosure. The present example embodiment may be understood as a method of forming a dielectric layer for a semiconductor device.

As illustrated in FIG. 1, the method of forming a dielectric layer according to the present example embodiment may start with operation S11 to prepare a semiconductor substrate having an active region.

The semiconductor substrate is a substrate used in a semiconductor device and having an active region. Here, the "active region" refers to a region electrically connected through a follow-up process, or the like. In general, the active region may be defined by an isolation region.

The semiconductor substrate may include a compound substrate such as a silicon-on-insulator (SOI) substrate or a germanium-on-insulator (GOI) substrate, as well as a unitary semiconductor substrate such as a silicon substrate, a germanium substrate, or a silicon-germanium substrate. Meanwhile, the semiconductor substrate may further include a region doped with a p-type or n-type impurity.

Subsequently, a dielectric layer may be formed on the active region in operation S13.

The dielectric layer may be used as various elements such as a gate insulating layer, an interlayer insulating layer, a capacitor dielectric material, and the like, in a semiconductor device. The dielectric layer may include a dielectric material having a high K (for example, higher than or equal to 10), as well as a silicon oxide ($SiO_2$), a silicon nitride ($SiN_x$), or a silicon oxy-nitride (SiON). In a specific example, the dielectric layer may include a plurality of layers formed of different dielectric materials. The dielectric layer may be formed through a chemical vapor deposition (CVD) process, a physical vapor deposition (PVD) process, an atomic layer deposition (ALD) process, or the like.

In general, the deposited dielectric material may have a bulk trap or an interface trap such as an oxygen vacancy. In particular, in case of a high-K dielectric material, a large amount of interface traps may be generated due to diffusion of atoms of a transition metal such as hafnium (Hf) or zirconium (Zr), potentially degrading electrical reliability of a semiconductor device (for example, a field effect transistor (FET), or the like).

In order to address the problem, a process of curing the dielectric layer may be performed in follow-up operations S15 and S17.

In operation S15, a curing layer formed of a material containing germanium (Ge) may be formed on the dielectric layer.

The curing layer refers to an element employed to cure a crystal defect of the dielectric layer and resultant bulk traps and interface traps to improve electrical characteristics of the dielectric layer. The curing layer may be formed through CVD, PVD, ALD, or the like. A material containing germanium (Ge) may be used to form the curing layer employed in the present example embodiment. For example, metal germanium or silicon germanium (SiGe) may be used as a material of the curing layer. In the case in which silicon germanium (SiGe) is used, the content of germanium (Ge) may be at least 10% (in a case in which silicon germanium (SiGe) is expressed as $Si_{1-x}Ge_x$, $x \geq 0.1$ may be satisfied).

The curing layer may be doped with a specific conductivity-type impurity. For example, the curing layer formed of silicon germanium (SiGe) may be doped with at least one of boron (B), arsenic (As), and phosphorous (P).

Subsequently, the curing layer may be heat-treated to cure the dielectric layer in operation S17.

The curing layer may be heat-treated at a temperature ranging from 500° C. to 1,300° C. In order to guarantee effective diffusion of the germanium element, the heat treatment process may be performed at a temperature ranging from 500° C. to 1,300° C. For example, the heat treatment process may be performed by a furnace, rapid thermal annealing (RTA), a rapid thermal process (RTP), flash lamp annealing, laser annealing, or the like.

During the heat-treatment process, the germanium element may be diffused to the interior of the dielectric layer and/or to an interface between the dielectric layer and the active region (e.g., a channel region). The diffused germanium element may cure the traps positioned within the dielectric layer and/or in the interface between the dielectric layer and a different region. As a result, the germanium element may be detected in the interior of the dielectric layer and/or the interface between the dielectric layer and the active layer in a final semiconductor device.

The heat treatment process is not particularly limited as long as it satisfies an atmosphere not allowing oxidization. For example, the heat treatment process may also be performed under any one of nitrogen ($N_2$), hydrogen ($H_2$), and nitrogen-hydrogen mixture atmospheres, or a vacuum atmosphere.

In this manner, after forming the dielectric layer, a defect due to chemical instability of the dielectric layer may be cured by a follow-up process including depositing the germanium-containing curing layer and performing the heat treatment process, thus improving electrical characteristics. In particular, since banding of an energy band in a junction interface is adjusted by using energy band gap characteristics of germanium different from silicon and a different semiconductor component, electrical characteristics may further be improved.

The dielectric layer may be applied to various elements of the semiconductor layer. For example, the dielectric layer may be used as a gate insulating layer in an FET, as a capacitor dielectric material of an device such as a dynamic random access memory (DRAM), or as an interlayer dielectric (ILD) film. Thus, the aforementioned dielectric layer forming method may be modified to various forms of a semiconductor manufacturing method so as to be implemented.

FIGS. 2A through 2E are cross-sectional views illustrating a sequential process of a method of manufacturing a semiconductor device according to an example embodiment of the present disclosure.

Figure 2A:
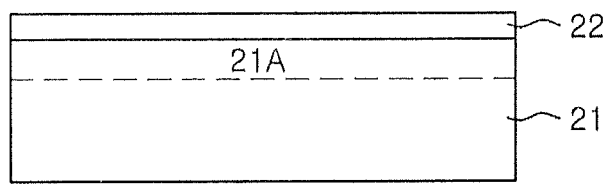
FIGS. 2A through 2E are cross-sectional views illustrating a sequential process of a method of manufacturing a semiconductor device according to an example embodiment of the present disclosure.

As illustrated in FIG. 2A, a dielectric layer 22 for gate insulation may be formed on an active region 21A of a semiconductor substrate 21.

The semiconductor substrate 21 may include a silicon substrate, a germanium substrate, a silicon-germanium substrate, a silicon-on-insulator (SOI) substrate, or a germanium-on-insulator (GOI) substrate. The active region 21A of the semiconductor substrate 21 may be a region doped with a p-type or n-type impurity. The active region 21A may be a channel region. In the present example embodiment, the channel region is illustrated as having a general flat structure, but the present disclosure is not limited thereto and a three-dimensional (3D) structure such as a fin shape or a structure such as a wire may also be used.

The dielectric layer 22 may be formed through CVD, PVD, ALD, or the like. The dielectric layer 22 may include a dielectric material having a high k (for example, higher than or equal to 10), as well as a silicon oxide ($SiO_2$), a silicon nitride ($SiN_x$), or a silicon oxy-nitride (SiON). For example, the dielectric layer 22 may be formed of at least one high k dielectric material selected from the group consisting of a hafnium oxide film ($HfO_2$), a hafnium silicon oxide film (HfSiO), a hafnium silicon oxy-nitride film (HfSiON), a hafnium oxy-nitride film (HfON), a hafnium aluminum oxide film (HfAlO), a hafnium lanthanum oxide film (HfLaO), a zirconium oxide film ($ZrO_2$), a tantalum oxide film ($TaO_2$), a zirconium silicon oxide film (ZrSiO), a lanthanum oxide film ($La2O_3$), a praseodymium oxide film ($Pr_2O_3$), a dysprosium oxide film ($Dy_2O_3$), a barium strontium titanate (BST) oxide film ($Ba_xSr_{1-x}TiO_3$), and a lead zirconate titanate (PZT) oxide film ($Pb(Zr_xTi_{1-x})O_3$).

Figure 2B:
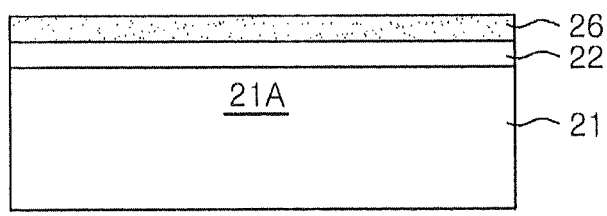

As illustrated in FIG. 2B, a curing layer 26 formed of a material containing germanium (Ge) may be formed on the dielectric layer 22.

The curing layer 26 may be formed of a material containing germanium (Ge). For example, metal germanium or silicon germanium (SiGe) may be used. The inventor of the present application ascertained that a defect of the dielectric layer 22 was effectively reduced by the germanium element employed in the curing layer 26 (please see Inventive Example and FIGS. 5 through 8). In the case in which silicon germanium is used to sufficiently obtain a dielectric layer curing effect of the germanium element, the content of germanium (Ge) may be at least 10%. The curing layer 26 may be formed through CVD, PVD, ALD, or the like.

As in the foregoing example as discussed above, the curing layer 26 may be doped with a specific conductivity-type impurity. For example, the curing layer formed of silicon germanium (SiGe) may be doped with at least one of boron (B), arsenic (As), and phosphorous (P). Impurity concentration of the curing layer 26 may range from $10^{15}$ atoms/cm$^2$ to $10^{19}$ atoms/cm$^2$, but the present disclosure is not limited thereto. An impurity doping in the curing layer 26 may be performed as an in situ process during the curing layer deposition process. Alternatively, the impurity doping in the curing layer 26 may be performed during an ion implantation process as a follow-up process. For example, in a case in which ion implantation is performed in a follow-up process, the curing layer 26 may be doped during the ion implantation process for forming other impurity regions (e.g., source and/or drain regions), rather than during an additional process.

Figure 2C:
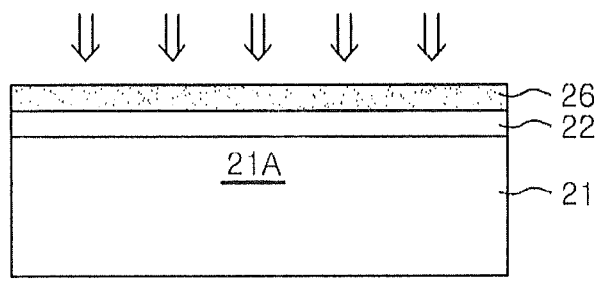

As illustrated in FIG. 2C, the curing layer 26 may be heat-treated to cure the dielectric layer 22.

The heat treatment process may be performed at a temperature ranging from 500° C. to 1,300° C. The heat treatment may be performed within a range from 5 seconds to 200 seconds, but duration of the heat treatment may not be limited thereto. In order to effectively diffuse germanium and ensure device stability, the heat treatment may be performed at a temperature ranging from 750° C. to 1,000° C. The heat treatment may be performed by a furnace, rapid thermal annealing (RTA), a rapid thermal process (RTP), flash lamp annealing, laser annealing, or the like.

During the heat treatment process, the germanium element of the curing layer 26 may be diffused to the dielectric layer 22. The germanium element diffused to the dielectric layer 22 may cure traps positioned in the interior of the dielectric layer 22 and/or in the interface between the dielectric layer 22 and the channel region 21A. As a result, the germanium element may be detected from the interior of the dielectric layer and/or the interface between the dielectric layer 22 and the active layer 21A in a final semiconductor device. This may be understood as an outcome of curing by germanium diffused during the heat treatment process.

Figure 2D:
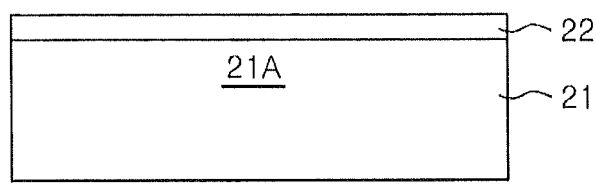

As illustrated in FIG. 2D, after the heat treatment process, the curing layer 26 may be removed from the dielectric layer 22.

The curing layer 26 may be removed through an appropriate etching process in which selectivity with respect to the dielectric layer 22 is guaranteed. Namely, an appropriate etching process such as dry or wet etching may be performed by using an etchant having high selectivity with respect to the curing layer 26 and the dielectric layer 22.

In the present example embodiment, the curing layer 26 is removed after the heat treatment is performed, but the curing layer 26 may not be removed or only a portion thereof may be removed. For example, an ingredient of the heat-treated curing layer 26 may be provided as an element (e.g., electrode) provided in an upper portion of the dielectric layer 22 in the semiconductor device. In this case, a portion of the curing layer 26 may be left on the dielectric layer 22 rather than being removed, or the curing layer 26 may be retained without performing the removal process.

Figure 2E:
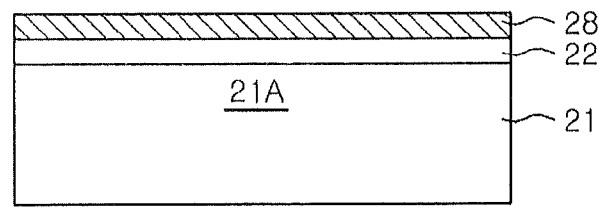

As illustrated in FIG. 2E, a gate electrode 28 may be formed on the dielectric layer 22.

The gate electrode 28 may include at least one component selected from among metals such as copper (Cu), titanium (Ti), tantalum (Ta), ruthenium (Ru), tungsten (W), cobalt (Co), nickel (Ni), aluminum (Al), hafnium (Hf), zirconium (Zr), palladium (Pd), platinum (Pt), molybdenum (Mo), and the like, silicides such as polysilicon (poly-Si), WSi, and the like, nitrides such as TiN, WN, and TaN, and a carbide such as TiAlC. The gate electrode 28 may be formed through CVD, PVD, ALD, or the like.

In this manner, after forming the dielectric layer, a defect of the dielectric layer may be effectively cured by depositing the germanium-containing curing layer and heat-treating the same. As a result, electrical characteristics and reliability of the semiconductor device may be significantly improved.

In the aforementioned example embodiment, the dielectric layer is illustrated and described as a single layer, but it may include a plurality of layers. Also, the configuration in which the curing layer is directly provided on the dielectric layer is illustrated, but a different element (e.g., a protective capping layer) for protecting the dielectric layer may be additionally formed before the curing layer is formed as needed. Details thereof will be described with reference to an example embodiment illustrated in FIGS. 3A through 3E.

FIGS. 3A to 3E are cross-sectional views illustrating a sequential process of a method of manufacturing a semiconductor device according to another example embodiment of the present disclosure. Unless otherwise mentioned, the same elements illustrated in FIGS. 2A through 2E and related descriptions thereof will be applied as descriptions of the present example embodiment.

Figure 3A:
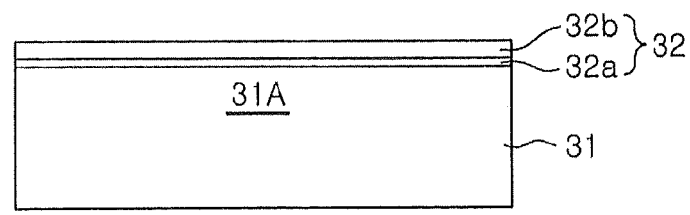
FIGS. 3A to 3E are cross-sectional views illustrating a sequential process of a method of manufacturing a semiconductor device according to another example embodiment of the present disclosure.

As illustrated in FIG. 3A, a dielectric layer 32 for gate insulation is formed on an active region 31A of a semiconductor substrate 31.

Unlike the former example embodiment, the dielectric layer 32 may include a plurality of layers 32a and 32b. In the present example embodiment, the plurality of layers constituting the dielectric layer 32 may be an interface layer 32a and a high-k layer 32b, but the dielectric layer 32 may be variously configured according to types of semiconductor devices.

If the high-k layer 32b is directly formed on the semiconductor layer 31, interface characteristics thereof may not be excellent. For example, dangling bonding and/or charge trapping may be increased in an interface between the semiconductor layer 31 and the high-k layer 32b, drastically degrading device reliability. In order to mitigate this problem, the interface layer 32a may be introduced between the high-k layer 32b and the semiconductor layer 31.

The interface layer 32a may be a low-k layer (e.g., $SiO_2$, or SiON) having excellent interface characteristics with the semiconductor substrate 31, relative to a high-k layer. The interface layer 32a may be formed through thermal oxidation or radical oxidation, as well as deposition. In general, in a case in which film quality of the high-k layer 32b is excellent, the interface layer 32a may be omitted. The high-k layer 32b may be formed of at least one high-k layer selected from the group consisting of a hafnium oxide film ($HfO_2$), a hafnium silicon oxide film (HfSiO), a hafnium silicon oxy-nitride film (HfSiON), a hafnium oxy-nitride film (HfON), a hafnium aluminum oxide film (HfAlO), a hafnium lanthanum oxide film (HfLaO), a zirconium oxide film ($ZrO_2$), a tantalum oxide film ($TaO_2$), a zirconium silicon oxide film (ZrSiO), a lanthanum oxide film ($La2O_3$), a praseodymium oxide film ($Pr_2O_3$), a dysprosium oxide film ($Dy_2O_3$), a barium strontium titanate (BST) oxide film ($Ba_xSr_{1-x}TiO_3$), and a lead zirconate titanate (PZT) oxide film ($Pb(Zr_xTi_{1-x})O_3$). The high-k layer 32b may be formed through CVD, PVD, ALD, or the like. The interface layer 32a may have a thickness ranging from 3 Å to 30 Å, and the high-k layer 32b may have a thickness ranging from 3 Å to 40 Å, but the present disclosure is not limited thereto.

Figure 3B:
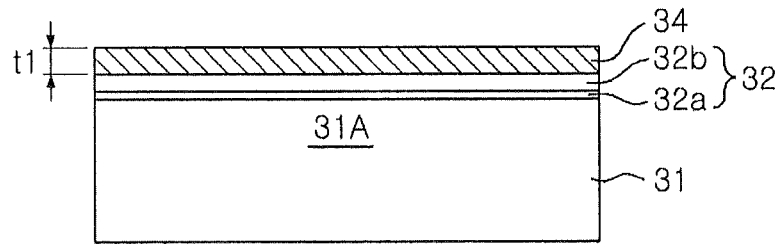

As illustrated in FIG. 3B, a protective capping layer 34 may be formed on the dielectric layer 32.

The protective capping layer 34 may protect the dielectric layer 32 during a follow-up process. For example, the protective capping layer 34 may protect the dielectric layer 32 during a heat treatment process or an etching process performed to remove a curing layer after the heat treatment process.

The protective capping layer 34 may be formed of a conductive material to be used as an electrode. For example, the protective capping layer 34 may be provided as an electrode structure such as a gate electrode. The protective capping layer 34 may include silicides such as polysilicon (poly-Si), WSi, and the like, nitrides such as TiN, WN, and TaN, and a carbide such as TiAlC, as well as metals such as copper (Cu), titanium (Ti), tantalum (Ta), ruthenium (Ru), tungsten (W), cobalt (Co), nickel (Ni), aluminum (Al), hafnium (Hf), zirconium (Zr), palladium (Pd), platinum (Pt), molybdenum (Mo), and the like.

The protective capping layer 34 may be formed under conditions (material and/or thickness) in which diffusion of a germanium element to the dielectric layer 32 or to an interface between the dielectric layer 32 and a different region is not hindered in the following heat treatment process (please see FIG. 3D). The protective capping layer 34 may have a thickness t1 ranging from 3 Å to 100 Å, but the present disclosure is not limited thereto.

Figure 3C:
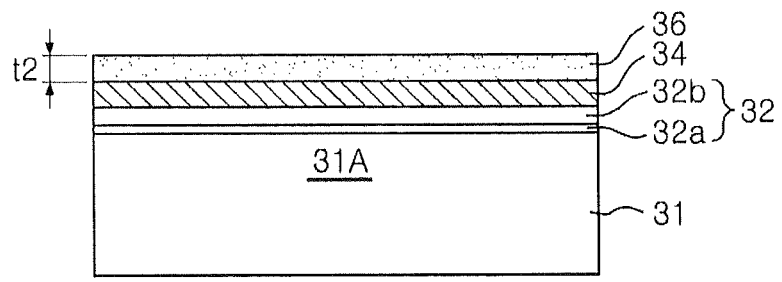

As illustrated in FIG. 3C, a curing layer 36 formed of a material containing germanium (Ge) may be formed on the protective capping layer 34.

The germanium-containing material may include metal germanium or silicon germanium (SiGe). In the case of using silicon germanium (SiGe), the content of germanium (Ge) may be at least 10%. The curing layer 36 may be doped with a specific conductivity-type impurity. For example, the curing layer 36 formed of silicon germanium (SiGe) may be doped with at least one of boron (B), arsenic (As), and phosphorous (P). The curing layer 36 may be formed to have a thickness ranging from tens of Å to hundreds of Å, but the present disclosure is not limited thereto. For example, a thickness t2 of the curing layer 36 may range from 50 Å to 800 Å.

Figure 3D:
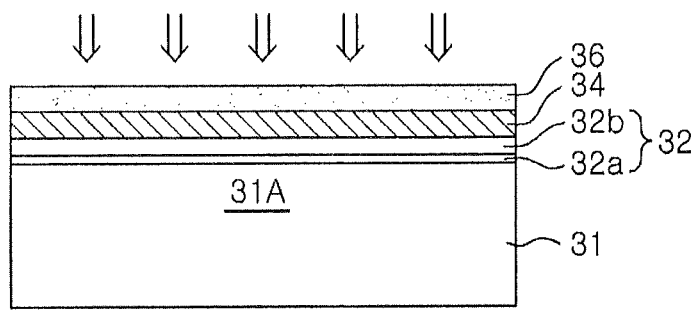

As illustrated in FIG. 3D, the curing layer 36 may be heat-treated to cure the dielectric layer 32.

The heat treatment process may be performed at a temperature ranging from 500° C. to 1,300° C. In order to effectively diffuse germanium and ensure stability, the heat treatment may be performed at a temperature ranging from 750° C. to 1,000° C.

During the heat treatment process, the germanium element of the curing layer 36 may be diffused to the dielectric layer 32. The interface layer 32a having a relatively low k may also have a defect and may require a trap reduction technique according to the present example embodiment, together with the high-k layer 32b. In this manner, by diffusing the germanium element to the interface layer 32a and the high-k layer 32b, traps positioned in the interior of the dielectric layer 32 and/or in the interface between the dielectric layer 32 and the channel region 31A may be effectively cured. As a result, the germanium element may be detected in the interior of the dielectric layer and/or the interface between the dielectric layer 32 and the channel layer 31A in a final semiconductor device. This may be understood as an outcome of curing the dielectric layer 32 by germanium diffused during the heat treatment process.

Figure 3E:
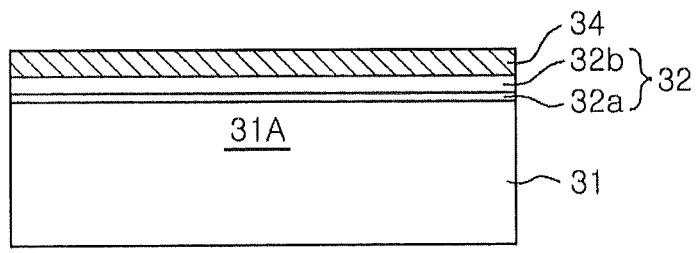

As illustrated in FIG. 3E, after the heat treatment process, the curing layer 36 may be removed from the protective capping layer 34.

During an etching process to remove the curing layer 36, the protective capping layer 34 may protect the dielectric layer 32. During this removal process, the protective capping layer 34 may remain on the dielectric layer 32. As described above, the protective capping layer 34 may be formed of an electrode material and used as an electrode structure such as a gate electrode. After the process of removing the curing layer 36, an additional electrode layer may be deposited on the protective capping layer 34 used as the electrode structure (please see the process of FIG. 9E).

In the present example embodiment, it is illustrated that only the curing layer 36 is selectively removed, but during the removal process, a portion or the entirety of the protective capping layer 34 may be removed together. In this case, an additional process such as a gate electrode forming process may be performed. Also, as in the former example embodiment as described above, the curing layer 36 may be partially removed or may not be removed.

In the former example embodiment, the method of forming the dielectric layer that may be used as a gate insulating layer has been described, but the present disclosure is not limited thereto and the corresponding method may also be advantageously applied as a method of forming a dielectric material used for various elements (e.g., an interlayer insulating layer, a capacitor dielectric material, or the like) of the semiconductor device.

FIGS. 4A through 4D are cross-sectional views illustrating a sequential process of a method of forming an interlayer insulating layer according to another example embodiment of the present disclosure.

Figure 4A:
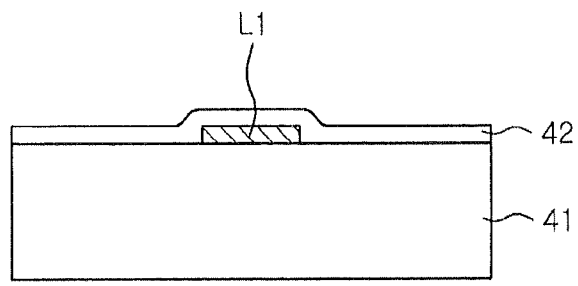
FIGS. 4A through 4D are cross-sectional views illustrating a sequential process of a method of forming an interlayer insulating layer according to another example embodiment of the present disclosure.

As illustrated in FIG. 4A, a dielectric layer 42 for interlayer insulation may be formed on a first conductive pattern L1 of a semiconductor substrate 41.

The semiconductor substrate 41 may include a silicon substrate, a germanium substrate, a silicon-germanium substrate, a silicon-on-insulator (SOI) substrate, or a germanium-on-insulator (GOI) substrate. The first conductive pattern L1 may be a metal wiring or an electrode constituting a semiconductor device.

The dielectric layer 42 may be formed through CVD, PVD, ALD, or the like. The dielectric layer 42 may include a dielectric material having a high k (for example, higher than or equal to 10), as well as a silicon oxide ($SiO_2$), a silicon nitride ($SiN_x$), or a silicon oxy-nitride (SiON).

Figure 4B:
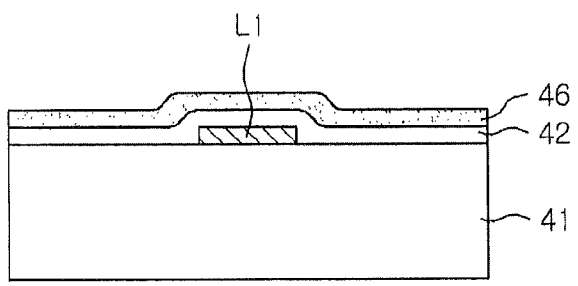

As illustrated in FIG. 4B, a curing layer 46 formed of a material containing germanium (Ge) may be formed on the dielectric layer 42.

The curing layer 46 may include metal germanium or silicon germanium (SiGe). In the case in which silicon germanium is used to sufficiently obtain a dielectric layer curing effect of the germanium element, the content of germanium (Ge) may be at least 10%. The curing layer 46 may be formed through CVD, PVD, ALD, or the like.

Figure 4C:
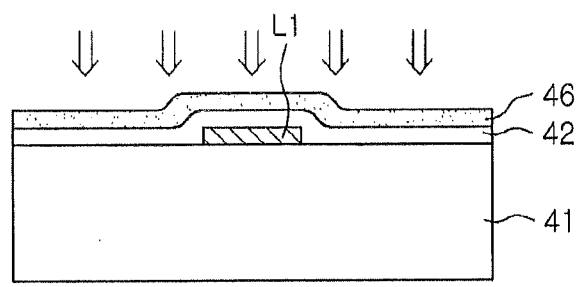

As illustrated in FIG. 4C, the curing layer 26 may be heat-treated to cure the dielectric layer 42 for interlayer insulation.

The heat treatment process may be performed at a temperature ranging from 500° C. to 1,300° C. The heat treatment may be performed within a range from 5 seconds to 200 seconds, but duration of the heat treatment may not be limited thereto. In order to effectively diffuse germanium and ensure device stability, the heat treatment may be performed at a temperature ranging from 750° C. to 1,000° C. During the heat treatment process, the germanium element may be diffused to the dielectric layer 42 to cure a defect of the dielectric layer 42. As a result, even though the germanium element is not an element of the dielectric layer 42 as an interlayer insulating layer, the germanium element may be detected from the interior of the dielectric layer 42.

Figure 4D:
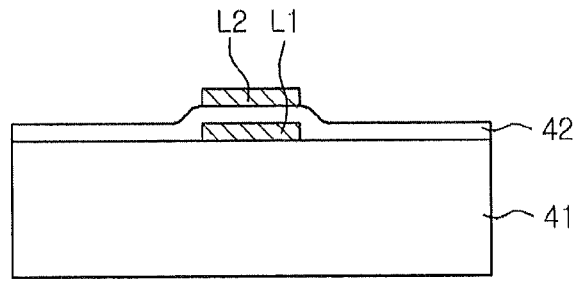

As illustrated in FIG. 4D, after the heat treatment process, the curing layer 46 may be removed from the dielectric layer 42, and a second conductive pattern L2 may be formed on the dielectric layer 42.

The curing layer 46 may be removed through an appropriate etching process in which selectivity with respect to the dielectric layer 42 is guaranteed. The second conductive pattern L2 may be a metal wiring or an electrode positioned at a level different from that of the first conductive level L1. By reducing traps of the dielectric layer 42 through curing according to the present disclosure, a leakage current that may be generated through the dielectric layer 42 may be reduced.

In this manner, after the dielectric layer is formed, a defect of the dielectric layer 42 may be effectively cured by depositing the germanium-containing layer and heat-treating the same, thus improving reliability of the dielectric layer 42 provided as an interlayer insulating layer. In the present example embodiment, the interlayer insulating layer is simply illustrated to be interposed between the first and second conductive patterns L1 and L2 respectively illustrated as a single wiring line, but the first and second conductive patterns L1 and L2 divided by the interlayer insulating layer may have a more complicate configuration, and the interlayer insulating layer may be implemented to have a configuration having a via structure allowing circuits at different levels to be connected therethrough.

Example embodiments described hereinafter are examples in which the newly proposed trap reduction technique is applied to various semiconductor devices. Various examples in which the trap reduction technique is applied to a process of forming different elements of a semiconductor device will be described with reference to the example embodiments hereinbelow.

FIGS. 5A to 5G are cross-sectional views illustrating a sequential process of a method of manufacturing a semiconductor device according to another example embodiment of the present disclosure. A semiconductor device of the present example embodiment may be understood as a field effect transistor (FET) such as a metal oxide silicon field effect transistor (MOSFET).

Figure 5A:
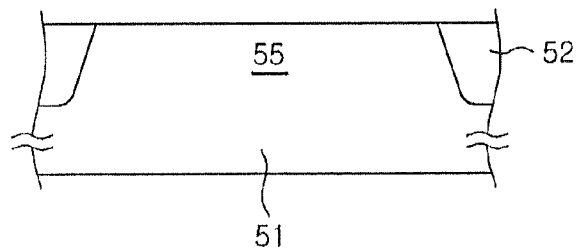
FIGS. 5A to 5G are cross-sectional views illustrating a sequential process of a method of manufacturing a semiconductor device according to another example embodiment of the present disclosure.

As illustrated in FIG. 5A, an active region 55 may be defined by an isolation region 52 on a semiconductor substrate 51.

The isolation region 52 may be formed by forming a trench defining the active region 55 at a predetermined depth in the semiconductor substrate 51 and forming an insulating layer such as a silicon oxide film in the trench using plasma enhanced chemical vapor deposition (PECVD).

In case of an n-MOSFET, an n-type well may be formed with an impurity such as phosphorus (P) or arsenic (As) in the active region 55 of the semiconductor substrate 51, and in case of a p-MOSFET, a p-type well may be formed with an impurity such as boron (B) in the active region 55 of the semiconductor substrate 51. In case of a complementary MOSFET, first and second conductivity-type wells may be formed and two MOSFET regions may be separated as isolation regions.

Figure 5B:
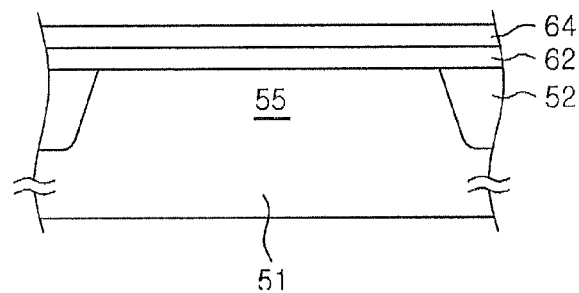

As illustrated in FIG. 5B, a gate insulating layer 62 and a protective capping layer 64 may be sequentially formed on the semiconductor substrate 51.

The gate insulating layer 62 may include a dielectric material having a high k (for example, higher than or equal to 10), as well as a silicon oxide ($SiO_2$), a silicon nitride ($SiN_x$), or a silicon oxy-nitride (SiON). For example, the gate insulating layer 62 may be formed of at least one high k dielectric material selected from the group consisting of a hafnium oxide film ($HfO_2$), a hafnium silicon oxide film (HfSiO), a hafnium silicon oxy-nitride film (HfSiON), a hafnium oxy-nitride film (HfON), a hafnium aluminum oxide film (HfAlO), a hafnium lanthanum oxide film (HfLaO), a zirconium oxide film ($ZrO_2$), a tantalum oxide film ($TaO_2$), a zirconium silicon oxide film (ZrSiO), a lanthanum oxide film ($La2O_3$), a praseodymium oxide film ($Pr_2O_3$), a dysprosium oxide film ($Dy_2O_3$), a barium strontium titanate (BST) oxide film ($Ba_xSr_{1-x}TiO_3$) and a lead zirconate titanate (PZT) oxide film ($Pb(Zr_xTi_{1-x})O_3$). The gate insulating layer 62 may include two or more dielectric layers. For example, the gate insulating layer 62 may include an interface layer and a high-k layer, similar to the example described above with reference to FIG. 3A.

The protective capping layer 64 may protect the gate insulating layer during a follow-up process. Also, the protective capping layer 64 may be formed of an electrode material having electrical conductivity so as to be utilized as a gate electrode. For example, the protective capping layer 64 may include silicides such as polysilicon (poly-Si), WSi, and the like, nitrides such as TiN, WN, and TaN, and a carbide such as TiAlC, as well as metals such as copper (Cu), titanium (Ti), tantalum (Ta), ruthenium (Ru), tungsten (W), cobalt (Co), nickel (Ni), aluminum (Al), hafnium (Hf), zirconium (Zr), palladium (Pd), platinum (Pt), molybdenum (Mo), and the like.

Figure 5C:
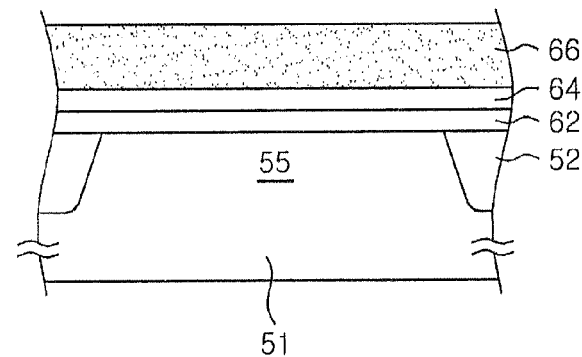

Thereafter, as illustrated in FIG. 5C, a curing layer 66 may be formed on the protective capping layer 64.

The curing layer 66 may include metal germanium or silicon germanium (SiGe), for example, as a material containing germanium. In the case in which silicon germanium (SiGe) is used, the content of germanium (Ge) may be at least 10%. The curing layer 66 may be doped with a specific conductivity-type impurity. For example, the curing layer 36 formed of silicon germanium (SiGe) may be doped with at least one of boron (B), arsenic (As), and phosphorous (P). The curing layer 66 may be formed to have a thickness ranging from tens of Å to hundreds of Å, but the present disclosure is not limited thereto. For example, a thickness of the curing layer 66 may range from 50 Å to 800 Å.

Figure 5D:
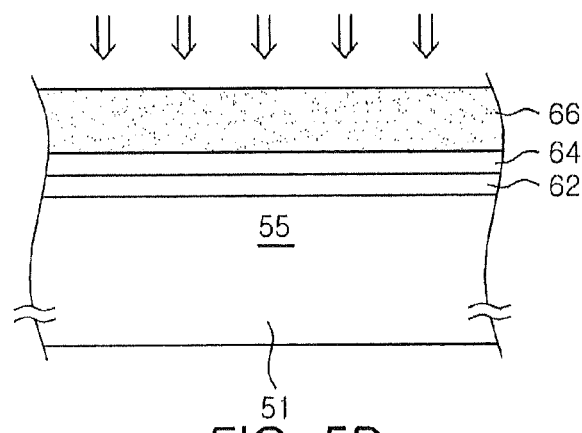

As illustrated in FIG. 5D, the curing layer 66 may be heat-treated to cure the gate insulating layer 62.

The heat treatment process may be performed at a temperature ranging from 500° C. to 1,300° C. The heat treatment may be performed within a range from 5 seconds to 200 seconds, but duration of the heat treatment may not be limited thereto. In order to effectively diffuse germanium and ensure device stability, the heat treatment may be performed at a temperature ranging from 750° C. to 1,000° C.

During the heat treatment process, the germanium element of the curing layer 66 may be diffused to the gate insulating layer 62. Traps positioned in the interior of the gate insulating layer 62 and/or the interface between the gate insulating layer 62 and the active region 65 may be effectively cured by the diffused germanium element. As a result, the germanium element may be detected from the interior of the gate insulating layer 62 and/or the interface between the gate insulating layer 62 and the active region 65 in the resultant semiconductor device.

Figure 5E:
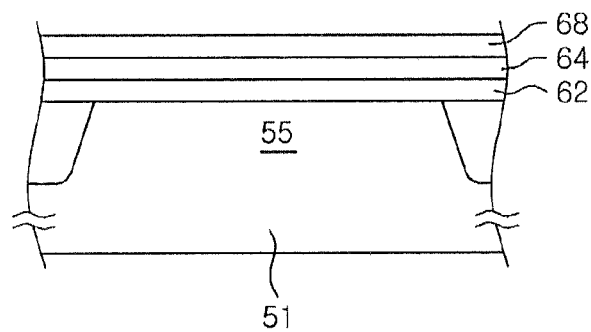

As illustrated in FIG. 5E, after the heat treatment process, the curing layer 66 may be removed from the protective capping layer 64 and an additional electrode layer 68 may be formed to provide a gate electrode 65.

During an etching process of removing the curing layer 66, the protective capping layer 64 may protect the gate insulating layer 62. During this removal process, the protective capping layer 64 may remain on the gate insulating layer 62, and the residual protective capping layer 64 may be provided as the gate electrode 65 together with the additional electrode layer 68.

The additional electrode layer 68 may be formed of a material identical to the electrode material employed as a material of the protective capping layer 64, or may also be formed of a material having characteristics different from those of the electrode material employed as a material of the protective capping layer 64, as needed. For example, the additional electrode layer 68 and the protective capping layer 64 may be formed of electrode materials having different electrical contact characteristics such as a work function.

Figure 5F:
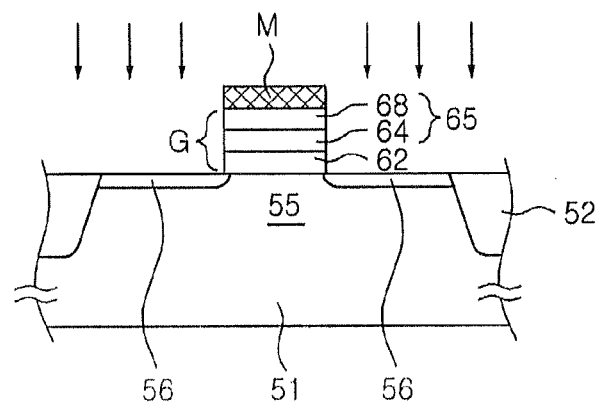

As illustrated in FIG. 5F, a gate structure G is formed, and a first doped region 56 may be formed on the semiconductor substrate 51 by using an ion implantation process.

During this process, the gate structure G having a desired shape may be formed by performing selective etching using a mask M. Subsequently, the first doped region 56 may be formed by using the mask M and the gate structure G as an ion implantation mask. The first doped region 56 may be positioned in an upper portion of the semiconductor substrate 51 adjacent to the gate structure G. An impurity of the first doped region may be an n-type impurity such as arsenic (As), or the like, or a p-type impurity such as boron (B), or the like. The first doped region 56 may be formed to be thin and to have low concentration, and in general, it may have a conductivity type opposite to that of the impurity of a well.

Figure 5G:
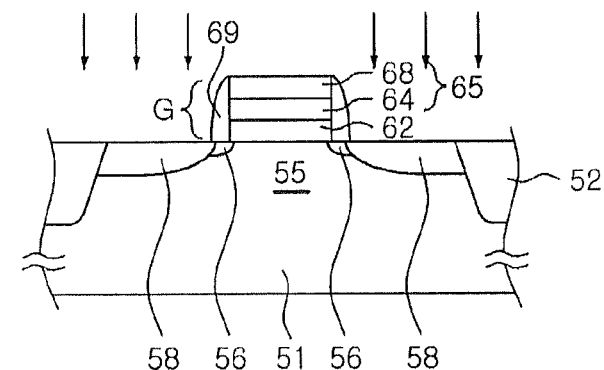

Referring to FIG. 5G, a side wall spacer 69 is formed on a side wall of the gate structure G, and a second doped region 58 is formed by using a second ion implantation process.

The side wall spacer 69 may be formed of a silicon oxide, a silicon nitride, a silicon oxy-nitride, or a combination thereof. Subsequently, the second doped region 58 may be formed on the semiconductor substrate 51 by using the gate structure G and the side wall spacer 69 as an ion implantation mask. The second doped region 58 may be positioned in an upper portion of the semiconductor substrate 51 adjacent to the gate structure G and the side wall spacer 69. After the ion implantation process for the second doped region 58, a heat treatment process may be further performed.

Through the ion implantation process, the first and second doped regions 56 and 58 may be provided as impurity regions for a source and a drain, whereby an MOS transistor including the impurity regions for a source and a drain and the gate structure G may be completed.

As described above, through the trap reduction process of forming the germanium-containing curing layer 66 and performing a heat treatment process, the germanium element may be diffused to cure a defect in the interior of the gate insulating layer 62 and the interface between the gate insulating layer 62 and the channel region. As a result, a semiconductor device having excellent electrical characteristics may be provided.

While in the method of manufacturing a semiconductor device (MOSFET) as described above, the case in which the trap reduction process is performed before the ion implantation process of forming the source and drain regions has been described, in a different manufacturing process, the trap reduction process may be performed after the ion implantation process is performed. Such a method of manufacturing a semiconductor device is illustrated in FIGS. 6A through 6H.

Figure 6A:
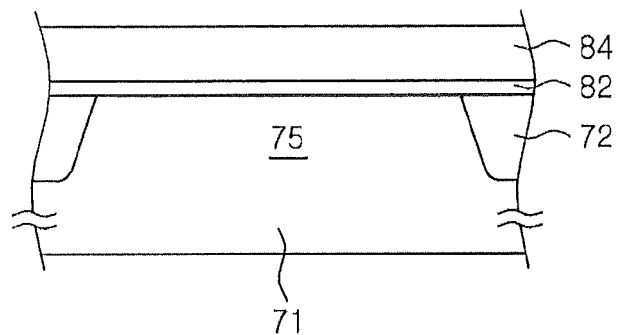
FIGS. 6A to 6H are cross-sectional views illustrating a sequential process of a method of manufacturing a semiconductor device according to another example embodiment of the present disclosure.

As illustrated in FIG. 6A, a dummy gate insulating layer 82 and a dummy gate electrode 84 may be sequentially formed on an active region 75 of a semiconductor substrate 71.

The active region 75 may be defined by an isolation region 72 on the semiconductor substrate 71, and the dummy gate insulating layer 82 and the dummy gate electrode 84 may be stacked on the active region 75.

The dummy gate insulating layer 82 may include a silicon oxide film ($SiO_2$). The dummy gate insulating layer 82 may be formed by using CVD, ALS, or thermal oxidation. For example, the dummy gate insulating layer 82 may be formed to have a thickness ranging from approximately 30 Å to 200 Å. The dummy gate electrode 84 may include polysilicon formed through CVD.

Figure 6B:
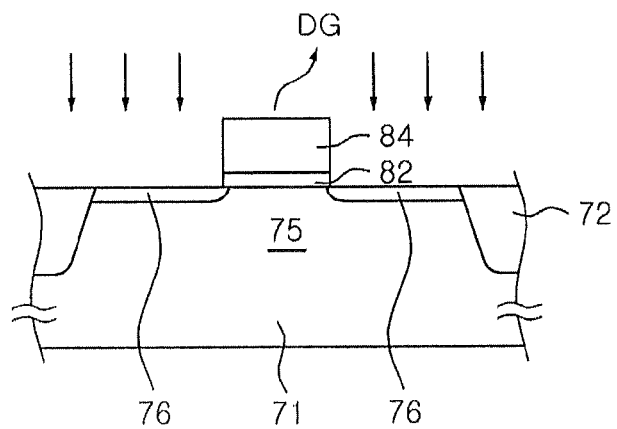

As illustrated in FIG. 6B, a gate structure G is formed and a first doped region 76 may be formed in the semiconductor substrate 71 by using an ion implantation process.

During this process, a dummy gate structure DG having a desired shape may be formed by using a selective etching process using a mask. Subsequently, the first doped region 76 may be formed by using the dummy gate structure DG as an ion implantation mask. The first doped region 76 may be positioned in an upper portion of the semiconductor substrate 71 adjacent to the dummy gate structure DG.

Figure 6C:
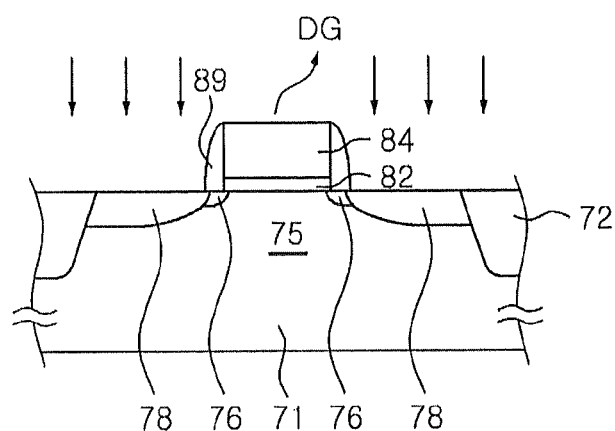

Subsequently, as illustrated in FIG. 6C, a side wall spacer 89 may be formed on side wall of the dummy gate structure DG, and a second doped region 78 may be formed in the semiconductor substrate 71 by using a second ion implantation process.

The side wall spacer 89 may be formed of a silicon oxide, a silicon nitride, a silicon oxy-nitride, or a combination thereof. Subsequently, the second doped region 78 may be formed in the semiconductor substrate 71 using the dummy gate structure DG and the side wall spacer 89 as an ion implantation mask. The second doped region 78 may be positioned in an upper portion of the semiconductor substrate 71 adjacent to the dummy gate structure DG and the side wall spacer 89. A heat treatment process may be further performed after the ion implantation process for the second doped region 78. In this manner, the first and second doped regions 76 and 78 may be provided as impurity regions for a source and a drain.

Figure 6D:
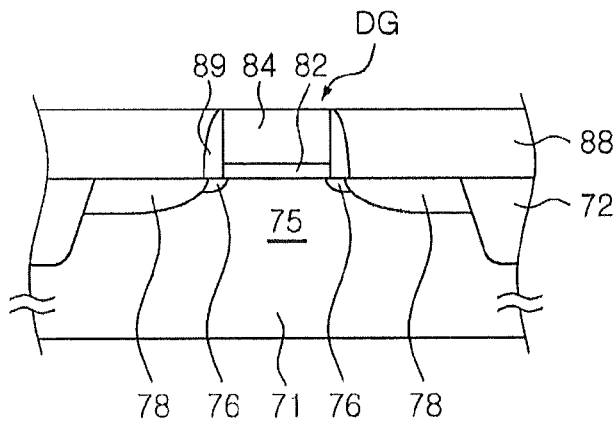

Thereafter, as illustrated in FIG. 6D, a mold insulating layer 88 may be formed on the semiconductor substrate 71.

The mold insulating layer 88 may be formed to surround the side wall spacer 89 and the dummy gate structure DG. For example, the mold insulating layer 88 may include a silicon oxide film. The mold insulating layer 88 may be formed through low pressure chemical vapor deposition (LPCVD) or plasma enhanced chemical vapor deposition (PECVD) and subsequently be planarized to allow the dummy gate electrode 86 to be exposed. Such a planarization of the mold insulating layer 88 may be performed through chemical mechanical polishing (CMP) or an etch-back process.

Figure 6E:
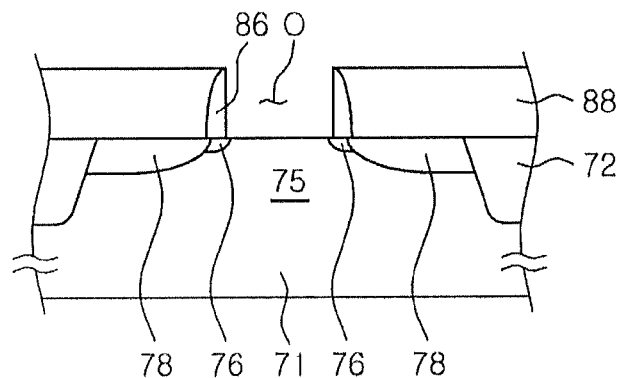

As illustrated in FIG. 6E, the dummy gate structure DG may be removed to form a trench O.

During this process, the active region 75 may be exposed due to the trench O. In a follow-up process, an actual gate structure may be formed on the active region exposed by the trench O (please see FIGS. 6F and 6G). The dummy gate structure DG may be removed through wet etching and dry etching. The mold insulating layer 88 and the side wall spacer 89 may be used as an etching mask when the dummy gate structure DG is removed.

Figure 6F:
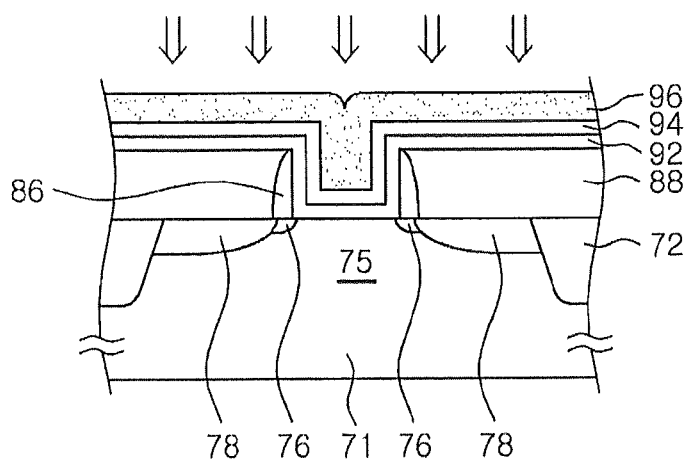

Subsequently, as illustrated in FIG. 6F, a gate insulating layer 92, a protective capping layer 94, and a curing layer 96 may be sequentially formed, and the curing layer 96 may be heat-treated to cure the gate insulating layer 92.

The gate insulating layer 92 may be formed of a dielectric material identical to that of the former example embodiment as described above, and may include a single layer or a plurality of layers. The protective capping layer 94 may protect the gate insulating layer 92 in a follow-up process. Also, as in the former example embodiment as described above, the protective capping layer 94 may be formed of an electrode material having electrical conductivity so as to be used as part of a gate electrode. The curing layer 96 may include metal germanium or silicon germanium (SiGe). In the case in which silicon germanium (SiGe) is used, the content of germanium (Ge) may be at least 10%. The curing layer 96 may be doped with a specific-type impurity.

The heat treatment process may be performed at a temperature ranging from 500° C. to 1,300° C. During this heat treatment process, the germanium element of the curing layer 96 may be diffused to the gate insulating layer 92. Traps positioned in the interior of the gate insulating layer 92 and/or an interface between the gate insulating layer 92 and the active region 75 may be effectively cured by the diffused germanium element. As a result, the germanium element may be detected from the interior of the gate insulating layer 92 and/or the interface between the gate insulating layer 92 and the active region 75.

Figure 6G:
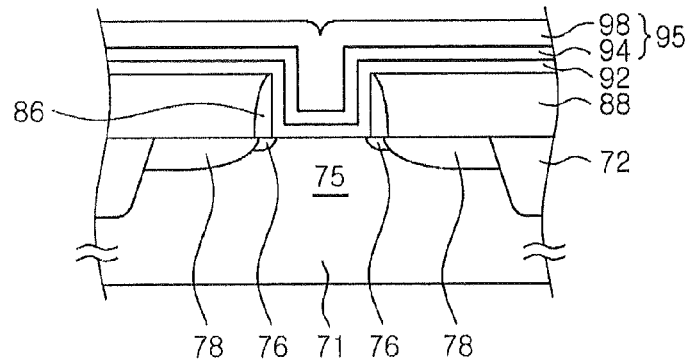

As illustrated in FIG. 6G, after the heat treatment process, curing layer 96 may be removed from the protective capping layer 94, and an additional electrode layer 98 may be formed to provide a gate electrode 95.

During the etching process of removing the curing layer 96, the protective capping layer 94 may protect the gate insulating layer 92. The residual protective capping layer 94 may be provided as the gate electrode 95 together with the additional electrode layer 98.

Figure 6H:
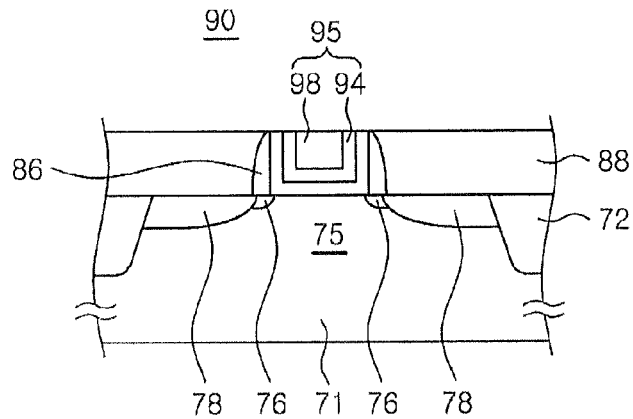

In addition, as illustrated in FIG. 6H, the gate electrode 95 positioned on the mold insulating layer 88 may be partially removed.

Such a removal process may be performed through an etch-back process or a CMP process. During this process, the gate electrode 95 positioned on the mold insulating layer 88 may be removed (a portion of the gate insulating layer 92 is also removed in this example embodiment) and the final gate electrode 95 may be disposed within the trench region.

In this manner, in the MOS transistor, by diffusing germanium to the gate insulating layer by using the new trap reduction technique of forming the germanium-containing curing layer and performing a heat treatment, a defect in the interior of the gate insulating layer and the interface may be effectively cured.

As a result, a gate leakage current may be reduced and device reliability items such as time dependent dielectric breakdown (TDDB), negative bias temperature instability (NBTI), and hot carrier injection (HCI) closely related to a dielectric defect may be significantly improved, and thus, the MOS transistor may have excellent electrical characteristics.

Hereinafter, reliability improvement effect of a semiconductor device according to example embodiments will be described in more detail with reference to specifically improved example embodiments and comparative examples.

Inventive Example

In order to confirm effects of the new trap reduction technique, an FET element was manufactured according to a method similar to the aforementioned example embodiment.

First, a $SiO_2$ interface layer and a $HfO_2$ high-k layer were formed as gate insulating layers on a silicon substrate. In detail, the $SiO_2$ interface layer was formed to have a thickness of approximately 5 Å at a temperature of approximately 900° C. on the silicon substrate by using a radical oxidation. Subsequently, the $HfO_2$ high-k layer was deposited such that each sample has thicknesses of approximately 15 Å, 20 Å, and 30 Å, respectively, by using CVD on the $SiO_2$ interface layer.

Next, a TiN film was deposited to have a thickness of approximately 20 Å on the gate insulating layer (i.e., the $HfO_2$ high-k layer) by using CVD, and an n-type $Si_{0.65}Ge_{0.35}$ was deposited as a curing layer to have a thickness of approximately 250 Å on the TiN film by using CVD. The curing layer according to the present example embodiment was doped with boron (B) with a concentration of approximately $5 \times 10^{16}$ atoms/$cm^2$ as a p-type impurity.

Subsequently, a heat treatment process was performed at a temperature ranging approximately from 800° C. to 900° C. within a duration ranging from approximately 60 seconds to 120 seconds by using furnace annealing. After the heat treatment process was completed, the curing layer was selectively removed, and TiN was additionally deposited on the residual TiN film to form a gate electrode.

Comparative Example 1

A trap reduction technique different from that of the Inventive Example was used. Namely, an FET element was manufactured through a process similar to that of the aforementioned Inventive Example, except that n-type polysilicon, instead of SiGe, was formed as a curing layer.

First, a $SiO_2$ interface layer and a $HfO_2$ high-k layer were formed as gate insulating layers on a silicon substrate. In detail, the $SiO_2$ interface layer was formed to have a thickness of approximately 5 Å at a temperature of approximately 900° C. on the silicon substrate by using a radical oxidation. Subsequently, the $HfO_2$ high-k layer was deposited such that each sample has thicknesses of approximately 15 Å, 20 Å, and 30 Å, respectively, by using CVD on the $SiO_2$ interface layer.

Next, a TiN film was deposited to have a thickness of approximately 20 Å on the gate insulating layer (i.e., the $HfO_2$ high-k layer) by using CVD, and an n-type polysilicon was deposited as a curing layer to have a thickness ranging from approximately 250 Å to 300 Å on the TiN film by using CVD. The curing layer according to the present example embodiment was doped with boron (B) with a concentration of approximately $5 \times 10^{16}$ atoms/$cm^2$ as a p-type impurity.

Subsequently, a heat treatment process was performed at a temperature ranging approximately from 800° C. to 900° C. within a duration ranging from approximately 60 seconds to 120 seconds by using furnace annealing. After the heat treatment process was completed, the curing layer was selectively removed, and TiN was additionally deposited on the residual TiN film to form a gate electrode.

Comparative Example 2

An FET element was manufactured through a process similar to that of the aforementioned Inventive Example, except that a curing layer was not introduced and only a heat treatment was applied after doping the n-type impurity (P).

First, a $SiO_2$ interface layer and a $HfO_2$ high-k layer were formed as gate insulating layers on a silicon substrate. In detail, the $SiO_2$ interface layer was formed to have a thickness of approximately 5 Å on the silicon substrate at a temperature of approximately 900° C. by using a radial oxidation process. Subsequently, the $HfO_2$ high-k layer was deposited such that each sample has thicknesses of approximately 15 Å, 20 Å, and 30 Å, respectively, on the $SiO_2$ interface layer by using a CVD process.

Next, a TiN film was deposited as a gate electrode to have a thickness of approximately 30 Å on the gate insulating layer (i.e., the $HfO_2$ high-k layer) by using a CVD process, and boron (B) was doped as a p-type impurity to have a concentration of approximately $5 \times 10^{16}$ atoms/$cm^2$ without a curing layer.

And then, a heat treatment process was performed at a temperature ranging from approximately 800° C. to 900° C. within a duration ranging from approximately 60 seconds to 120 seconds by using furnace annealing.

In order to confirm improvement effects such as trap reduction, or the like, with respect to FET elements obtained from Comparative Example 1 and Comparative Example 2, together with Inventive Example as described above, leakage currents and trap concentration per unit area were measured. The measurement results are shown in FIGS. 7 and 8.

Figure 7:
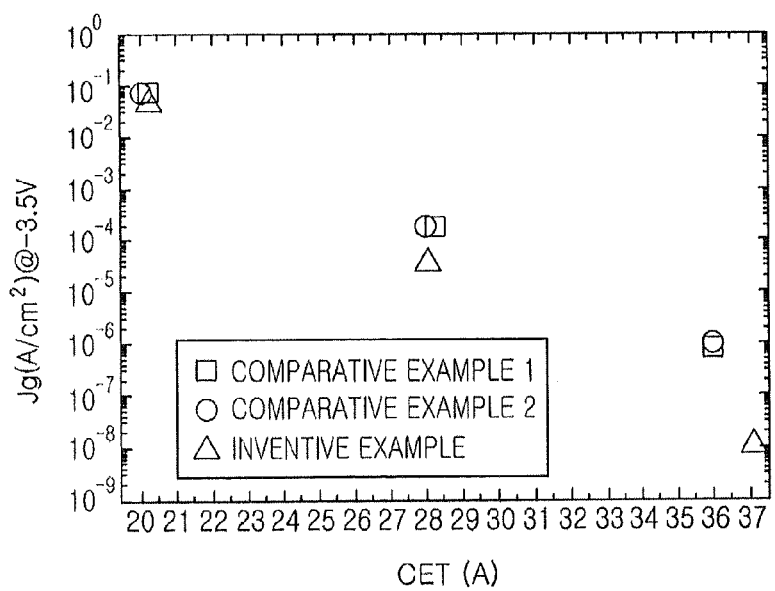
FIG. 7 is a graph illustrating a change in a leakage current (@−2.0V) over capacitance equivalent thickness (CET) of a gate insulating layer.

FIG. 7 is a graph illustrating a change in a gate leakage current (@−2.0V) over capacitance equivalent thickness (CET) of a gate insulating layer.

Referring to FIG. 7, there is no significant difference between the gate current density Jg of FET elements according to Comparative Example 1 and Comparative Example 2, but the gate current density Jg of the FET element according to the Inventive Example is significantly improved, relative to the results according to Comparative Example 1 and Comparative Example 2. In particular, it can be seen that as the CET is increased, the gate leakage current improvement effect of Inventive Example is further increased, and in the proximity of a region where CET is approximately 35 Å, the gate current density Jg is improved by a degree of 1 or more.

Figure 8:
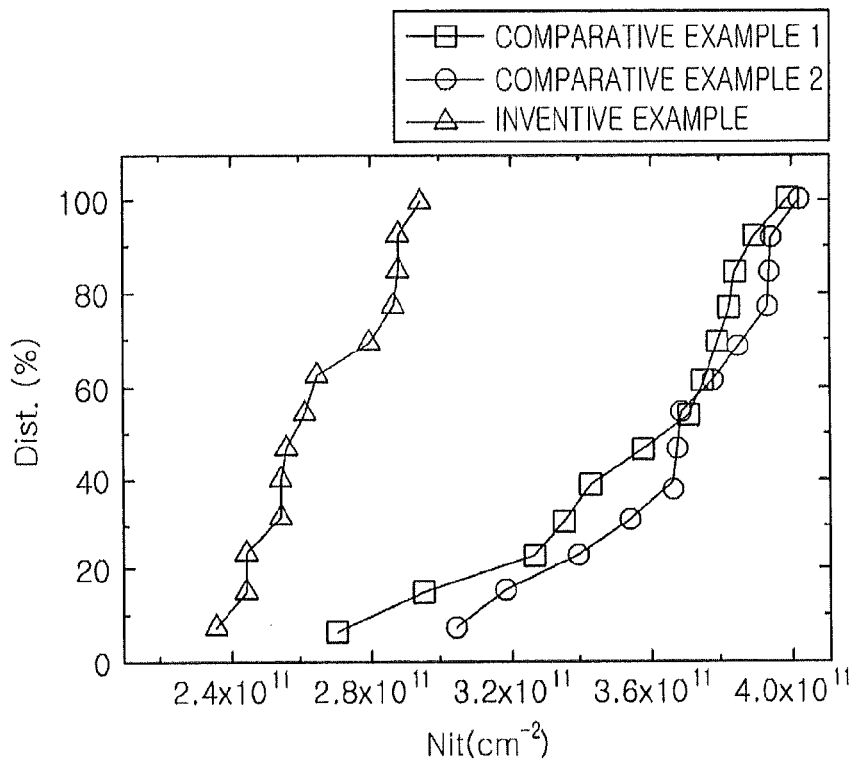
FIG. 8 is a graph illustrating trap concentration ($N_{it}$) per unit area in an interface between a gate insulating layer and a semiconductor layer (active region)

FIG. 8 is a graph illustrating trap concentration ($N_{it}$) per unit area in an interface between a gate insulating layer and a semiconductor layer.

Referring to FIG. 8, similar to the results of FIG. 5, there is no significant difference in the interface trap concentration ($N_{it}$) between Comparative Example 1 and Comparative Example 2 (although Comparative Example 1 has slightly improved interface trap concentration), while the interface trap concentration ($N_{it}$) of the FET element according to Inventive Example is distributed within the range of 2~3× $10^{11}/cm^2$, which is smaller by 20% to 40% or more than the results according to Comparative Example 1 and Comparative Example 2. As confirmed by Inventive Example, generally, the germanium element may be diffused to the interior of the dielectric layer and/or the interface thereof, and thus, the interface trap concentration ($N_{it}$) may be lowered to a level of $3 \times 10^{11}/cm^2$ or less. Obviously, if the growth conditions, or the like, are improved, a lower interface trap concentration may be anticipated.

Figure 9:
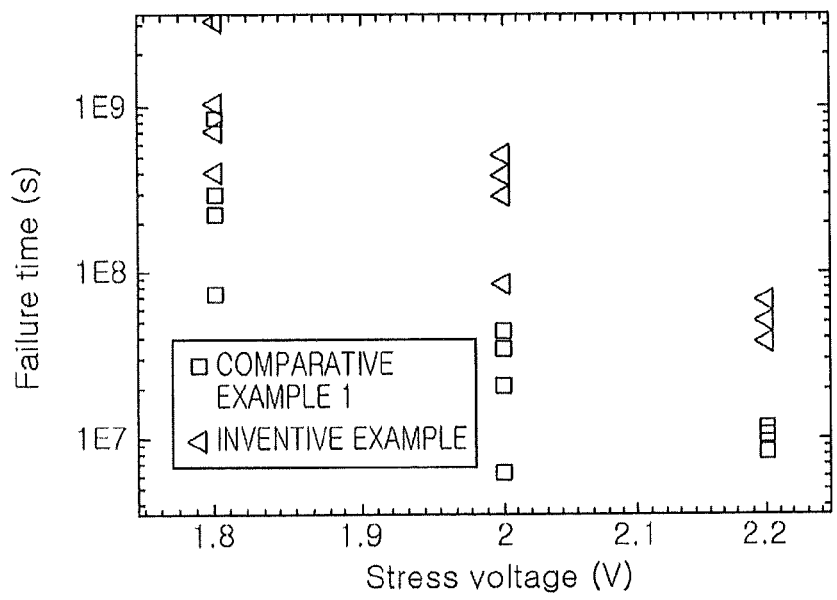
FIGS. 9 and 10 are graphs illustrating results of measuring life time of MOS transistors according to Inventive Example and Comparative Example 1.
Figure 10:
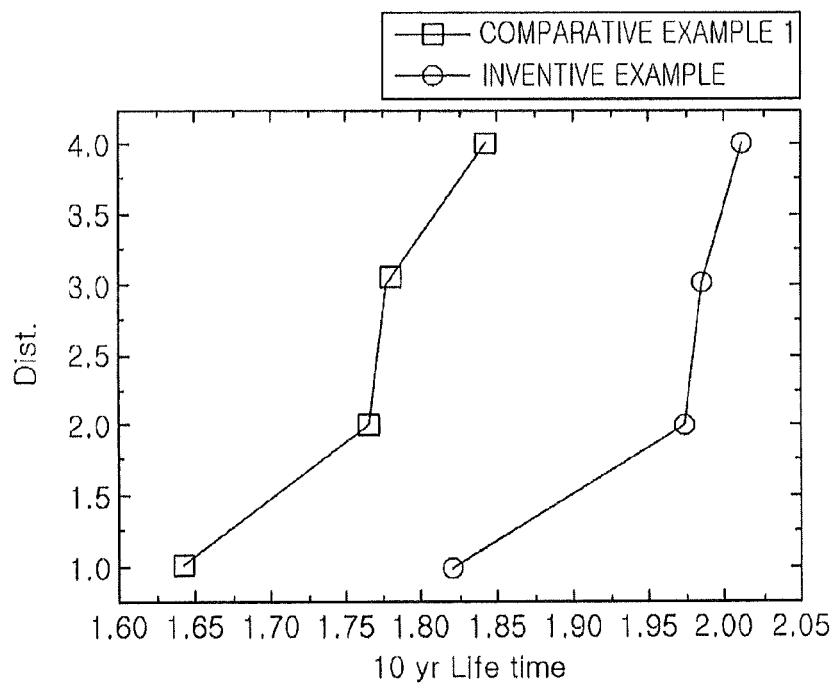

FIGS. 9 and 10 are graphs illustrating results of measuring life time of FET elements according to Inventive Example and Comparative Example 1.

Inventive Example exhibits a clear improvement in a desired life time (FIG. 9) over stress voltage and negative bias temperature instability (NBTI) results (FIG. 10). In particular, the NBTI results confirm that the FET element according to Inventive Example is improved by approximately 0.15V.

In this manner, the trap reduction technique of the dielectric layer applied to the foregoing example embodiments may significantly improve reliability of a semiconductor device such as an FET element. Such an improvement effect may be advantageously employed in a semiconductor memory device such as a DRAM or a non-volatile memory. Hereinafter, various example embodiments of a method of manufacturing a semiconductor memory device employing the new trap reduction technique will be described as other application examples.

Figure 11:
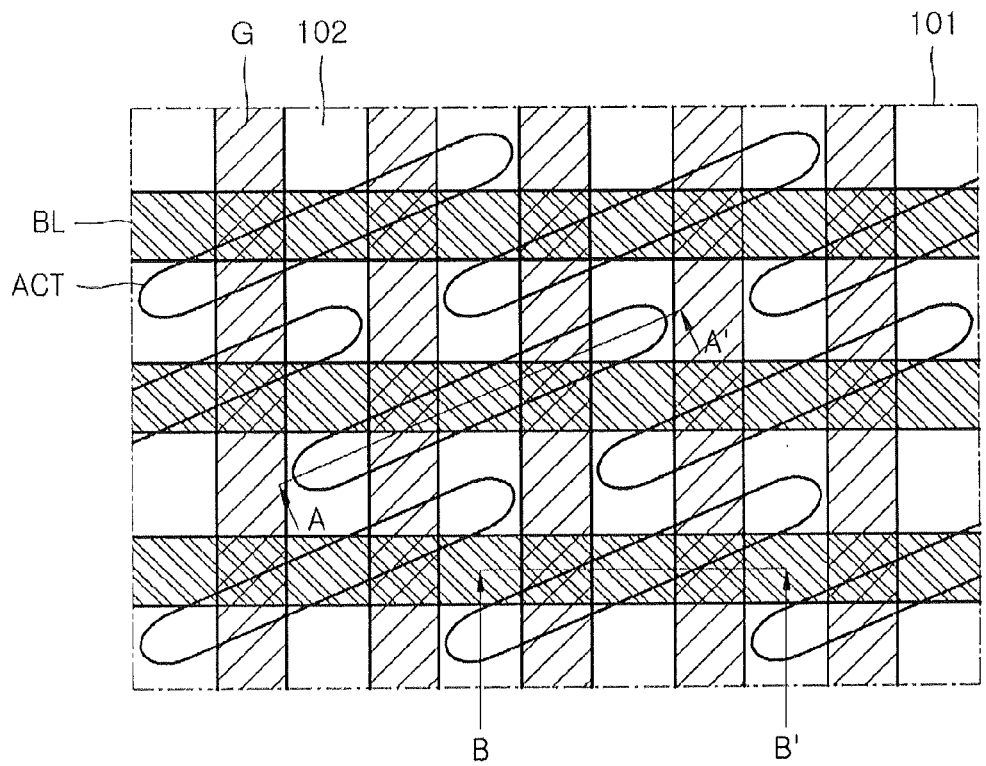
FIG. 11 is a plan view schematically illustrating a layout of a semiconductor device according to an example embodiment of the present disclosure.

FIG. 11 is a plan view schematically illustrating a layout of a semiconductor device according to an example embodiment of the present disclosure.

In a semiconductor device illustrated in FIG. 11, an isolation layer 102 defining a plurality of active regions ACT may be formed within a cell region of a substrate 101. A plurality of gate structures G may extend in a predetermined direction (in a vertical axis direction in FIG. 11) across an active region ACT and the isolation layer 102. Here, the plurality of gate structures G may be buried in the substrate 101. A plurality of bit lines BL may extend in a direction substantially perpendicular to a direction in which the plurality of gate structures G extend.

Meanwhile, in addition to the cell region, a peripheral circuit region may be provided in the substrate 101. In a below example embodiment, a method of forming a dielectric layer in a cell region will be described as an example, but the method may also be advantageously applied to a transistor element of a peripheral circuit region.

FIGS. 12 through 17 are cross-sectional views illustrating a sequential process of a method of manufacturing a semiconductor device (DRAM) according to an example embodiment of the present disclosure. Specifically, FIGS. 12 through 17 are cross-sectional views of the semiconductor device taken along lines A-A' and B-B' of FIG. 11.

The method of manufacturing a semiconductor device according to the present example embodiment is a method of manufacturing a semiconductor memory device such as a DRAM. Unless otherwise mentioned or unless not contracted, matters described in the former example embodiments may be associated with descriptions of the present example embodiment.

Figure 12:
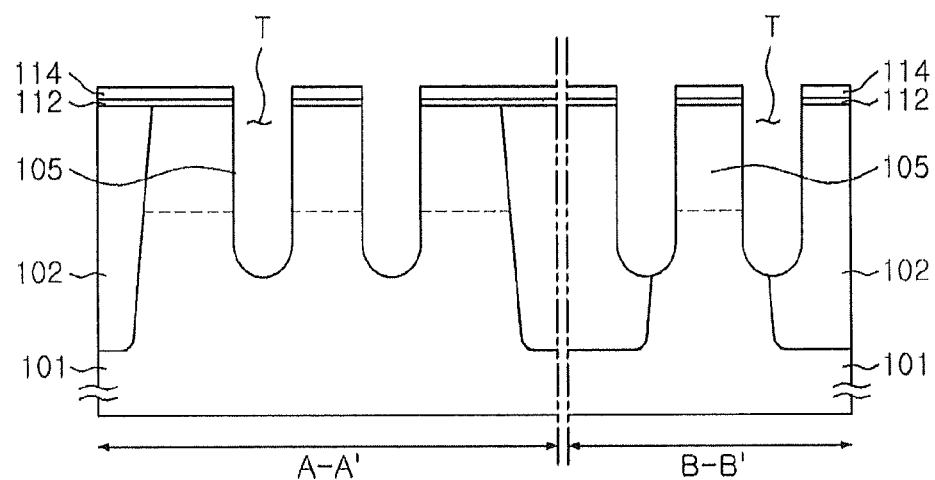
FIG. 12 is a cross-sectional view of the semiconductor device of FIG. 11 taken along lines A-A' and B-B'.

Referring to FIG. 12, an isolation layer 102 delimiting an active region may be formed on the substrate 101. The isolation layer 102 may be formed by using a shallow trench isolation process. Thereafter, an impurity region 105 may be formed by injecting impurities into the active region of the substrate 100. The impurities may include n-type impurities such as phosphorus (P) and arsenic (As) or p-type impurities such as boron (B).

Alternatively, impurities may be first injected into the substrate 101 and then the isolation layer 102 delimiting the active region may be subsequently formed to form an impurity region 105 in the active region.

A pad oxide film pattern 112 and a mask pattern 114 exposing portions of an upper surface of the substrate 101 may be formed on the substrate 101. The mask pattern 114 may be a hard mask formed of a nitride film or a polysilicon film. In a specific example, the mask pattern 114 may be a stacked structure of a hard mask and photoresist.

Trenches T may be formed by etching an upper portion of the substrate 101 exposed by using the mask pattern 114 as an etch mask. Since gate electrodes are formed within the trenches T in a follow-up process, the trenches T may be formed to be arranged according to the layout of FIG. 11.

As illustrated in FIG. 12, a plurality of trenches T are spaced apart from each other by predetermined intervals, and each of the trenches T may extend in an extending direction of the gate structures G. The etching process may be an anisotropic etching process. In the present example embodiment, after the anisotropic etching process, an isotropic etching process may be additionally performed to allow lower portions of the trenches T to have a rounded shape. Meanwhile, after the trenches T are formed, a baking process may be performed on the substrate 101 at a high temperature under a hydrogen ($H_2$) atmosphere.

Figure 13:
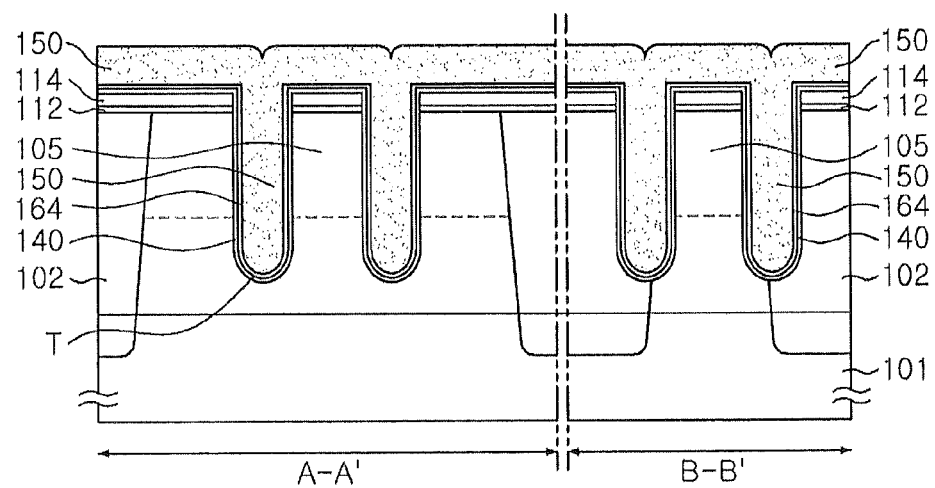
FIGS. 13 through 17 are cross-sectional views illustrating a sequential process of a method of manufacturing a semiconductor device according to an example embodiment of the present disclosure.

Referring to FIG. 13, a gate insulating layer 140 and a protective capping layer 164 are sequentially formed on a surface of the substrate 101 exposed from inner walls of the trenches T, and a germanium-containing curing layer 150 may be subsequently formed on the protective capping layer 164.

The gate insulating layer 140 may be formed of a dielectric material as described above in the former example embodiment, in particular, a dielectric material having a high k. The gate insulating layer 140 may be formed through thermal oxidation, CVD, ALD, or the like. The protective capping layer 164 may protect the gate insulating layer 140 during a follow-up process. Also, the protective capping layer 164 may be formed of a conductive material so as to be used as an electrode. Also, the protective capping layer 164 may have a thickness ranging from 3 Å to 100 Å, but the present disclosure is not limited thereto.

The curing layer 150 may include germanium or silicon germanium (SiGe) as a germanium-containing material. In the case of using silicon germanium (SiGe), the content of germanium (Ge) may be at least 10%. The curing layer 150 may be doped with a specific conductivity-type impurity. For example, the curing layer 150 formed of silicon germanium (SiGe) may be doped with at least one of boron (B), arsenic (As), and phosphorous (P). The curing layer 150 may be formed to have a thickness ranging from tens of Å to hundreds of Å, but the present disclosure is not limited thereto. For example, a thickness of the curing layer 150 may range from 50 Å to 800 Å.

In the present example embodiment, the curing layer 150 is formed to fully fill the trenches T. However, the curing layer 150 may be formed as a film along inner walls of the trenches T, rather than completely filling the interior of the trenches T according to a thickness of the curing layer 150 and sizes of the trenches T.

Figure 14:
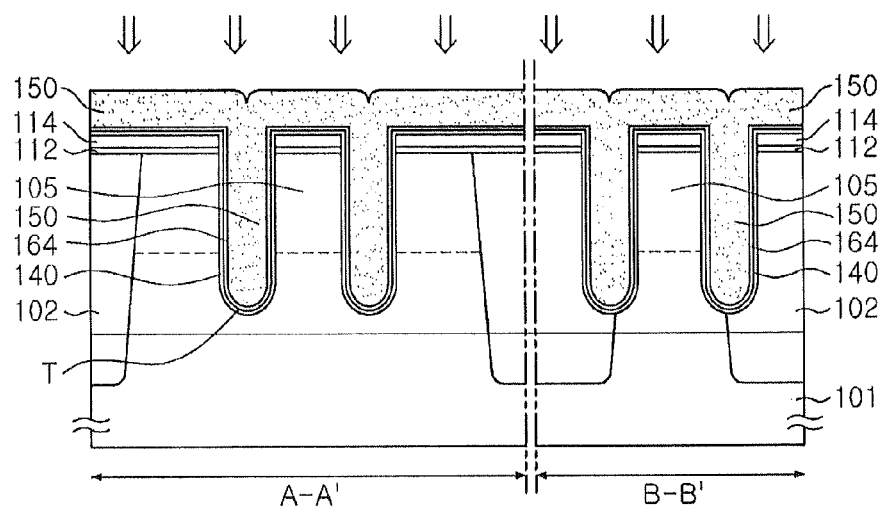

As illustrated in FIG. 14, a heat treatment process may be applied to the curing layer 150.

The heat treatment process may be performed at a temperature ranging from 500° C. to 1,300° C., and in order to guarantee effective diffusion of germanium, the heat treatment process may be performed at a temperature ranging from 750° C. to 1,000° C. During the heat treatment process, the germanium element of the curing layer 150 may be diffused to the gate insulating layer 140.

The germanium element diffused to the gate insulating layer 140 may effectively cure traps positioned in the interior of the gate insulating layer 140 and/or the interface of the gate insulating layer 140. As a result, the germanium element may be detected in the interior of the gate insulating layer 140 and/or the interface between the gate insulating layer 140 and the channel region in a final semiconductor device. This may be understood as an outcome of curing by germanium diffused during the heat treatment process.

Figure 15:
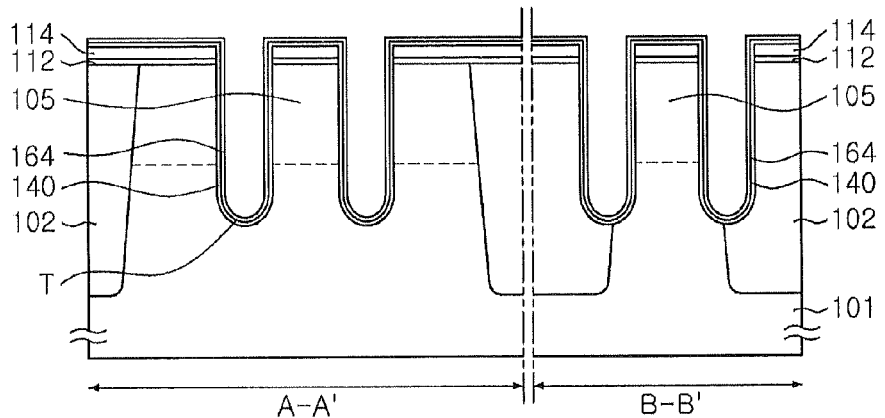

Subsequently, as illustrated in FIG. 15, the curing layer 150 may be removed, and thus, the protective capping layer 164 formed within the trenches T may be exposed.

This removal process may be performed through wet etching. During this process, the protective capping layer 164 may remain on the gate insulating layer 140 to protect the gate insulating layer 140. As discussed above, the protective capping layer 164 may be formed of an electrode material so as to be used as an electrode structure such as a gate electrode. Unlike the present example embodiment, during this removal process, a portion or the entirety of the protective capping layer 164 may be removed.

Figure 16:
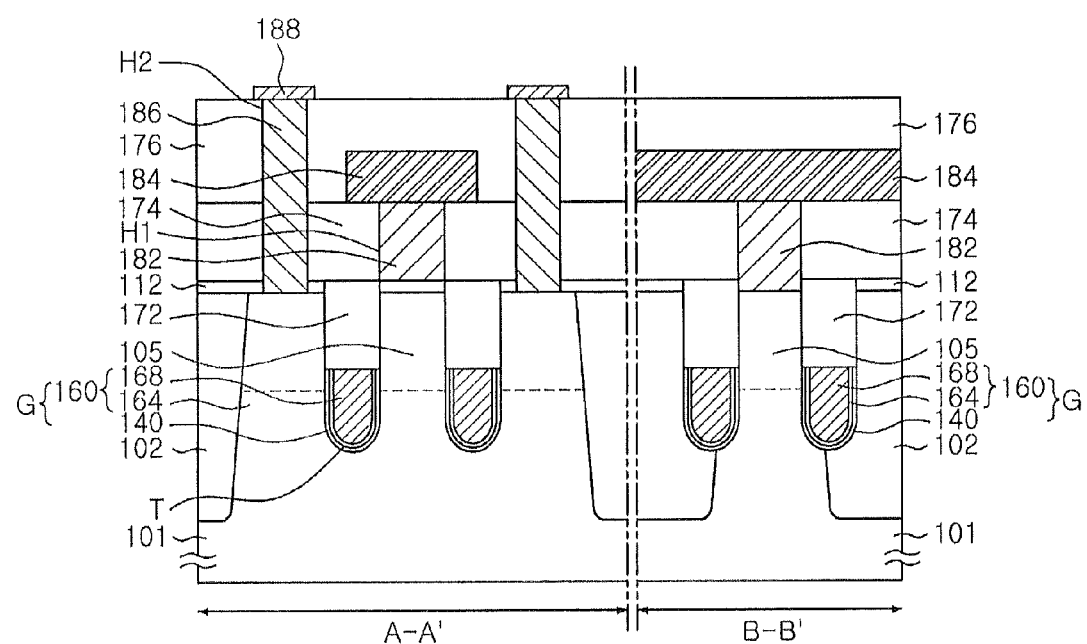

As illustrated in FIG. 16, after the gate electrode 160 is completed, a wiring structure may be formed.

The gate electrode 160 may include the protective capping layer 164 and an additional electrode 168. Here, the additional electrode 168 may be formed by forming an additional electrode material filling the trenches T on the protective capping layer 164 and applying etch-back to the filled electrode material. During this etch-back process, the protective capping layer 164 and the gate insulating layer 140 formed on upper portions of the trenches T may be removed together, exposing upper portions of the side walls of the trenches T. Also, the mask pattern 114 may be removed.

After an insulating material (not shown) filling the interior of the trenches T is formed on the gate insulating layer 160, the insulating material may be planarized to form a capping part 172 within the trenches T. Accordingly, the gate insulating layer 140 and the gate electrode 160 sequentially formed within the trenches T may form gate electrodes G. The gate structures G may be formed to be buried within the substrate 101.

A first interlayer insulating layer 174 may be formed on the pad oxide film pattern 112 and the capping part 172. A first opening H1 may be formed to pass through the first interlayer insulating layer 174 and the pad oxide film pattern 112 so as to expose the impurity region 105, and a conductive film filling the first opening H1 may be formed on the first interlayer insulating layer 174. The conductive film may be planarized until when the first interlayer insulating layer 174 is exposed, thus forming a bit line contact 182 electrically connected to the impurity region 105. A conductive film may be formed on the first interlayer insulating layer 174 and patterned to form a bit line 184 connected to a bit line contact 182 on the first interlayer insulting layer 174. Subsequently, a second interlayer insulating layer 176 covering the bit line 174 may be formed on the first interlayer insulating layer 174.

A second opening H2 may be formed to penetrate the first and second interlayer insulating layers 174 and 176 and the pad oxide film pattern 112 to expose the impurity region 105, and a capacitor contact 186 filling the second opening H2 may be formed. A contact pad 188 may be formed on the capacitor contact 186 and the second interlayer insulating layer 176.

Figure 17:
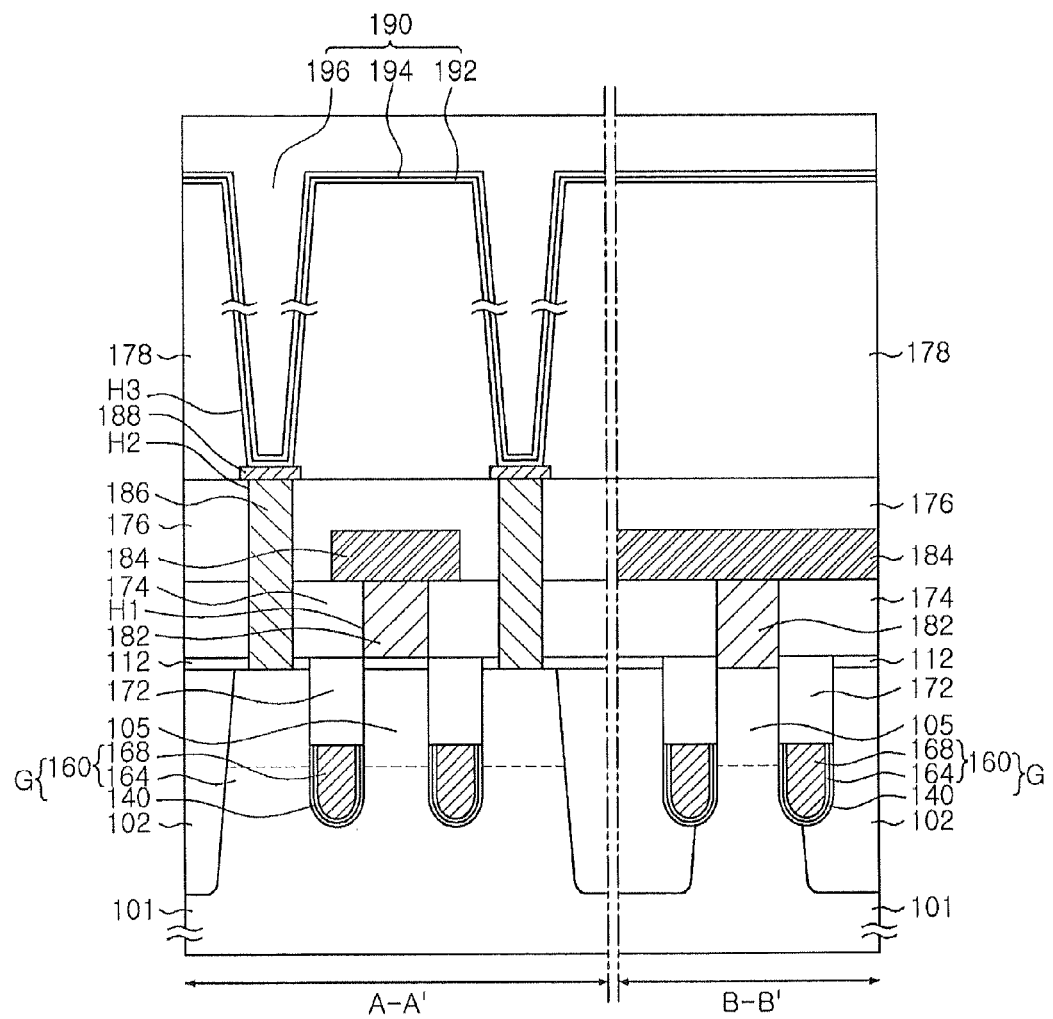

As illustrated in FIG. 17, a capacitor 190 may be formed on the contact pad 188.

The capacitor 190 may include a lower electrode 192, a dielectric layer 194, and an upper electrode 196. Two holes H3 for forming the capacitor 190 may be formed in a third interlayer insulating layer 178. Each one capacitor 190 may be formed on both sides of each active region ACT across which two buried gate electrodes 160 extend. The lower electrode 192 may be electrically connected to the impurity region 105 within the active region through the contact pad 188 and the capacitor contact 186. In this manner, in the semiconductor device such as a DRAM, after the germanium-containing curing layer is formed, germanium may be diffused to the gate insulating layer by using the trap reduction technique of performing a heat treatment, thus effectively curing a defect in the interior or the interface of the gate insulating layer.

As a result, the semiconductor device may have a reduced gate leakage current and significantly improved device reliability items such as time dependent dielectric breakdown (TDDB), negative bias temperature instability (NBTI), hot carrier injection (HCI), or the like, closely related to a dielectric defect, exhibiting excellent electrical characteristics.

In the present example embodiment, the case of the buried word line (gate electrode) constituting a buried channel array transistor is illustrated, but the present disclosure is not limited thereto. For example, in another example embodiment, a word line may be formed on the substrate 101 and extend in one direction, and even in this structure, the trap reduction technique using a germanium-containing layer after forming a gate insulating layer may be applied in a similar manner.

Figure 18:
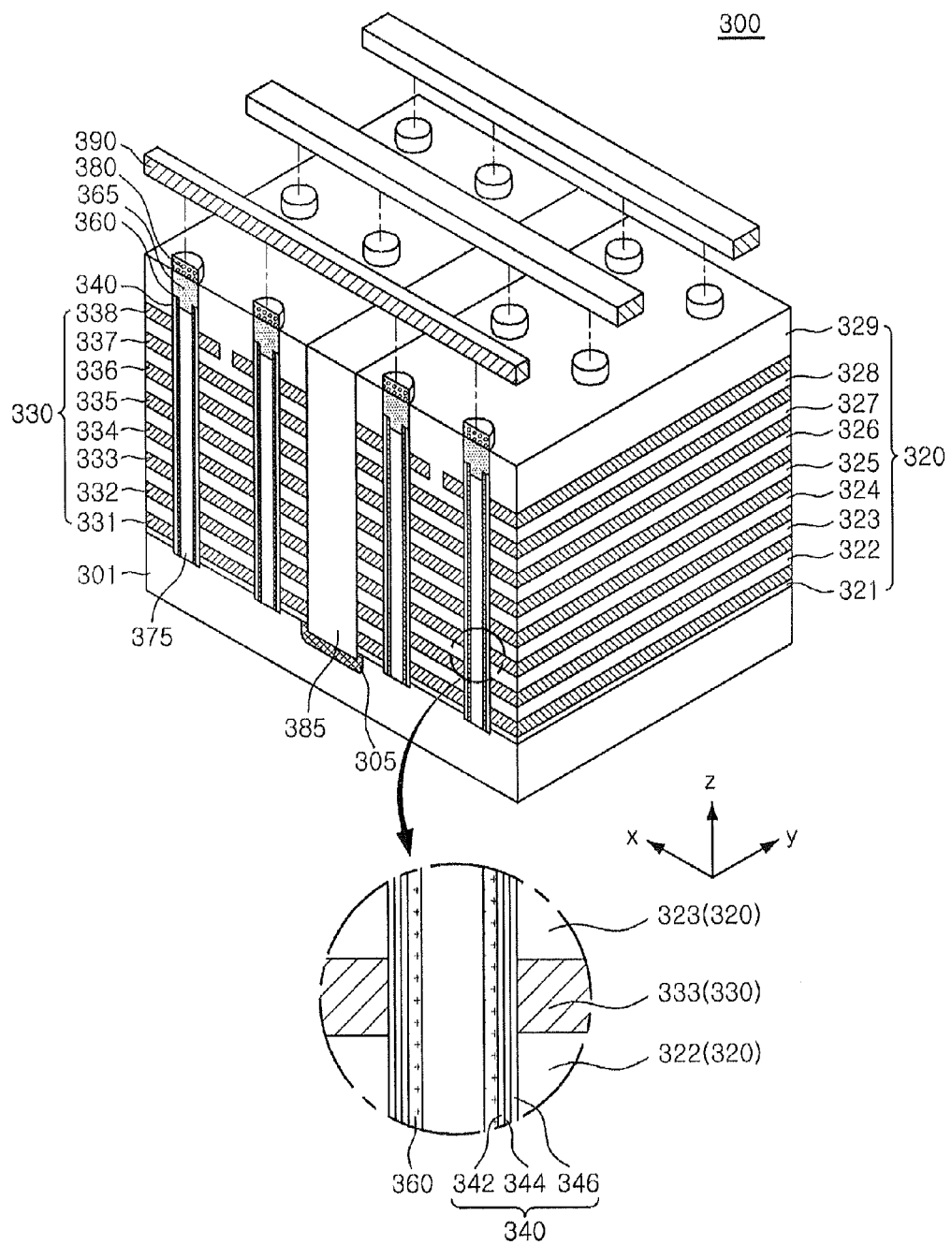
FIG. 18 is a perspective view illustrating a semiconductor device according to an example embodiment of the present disclosure.
Figure 19:
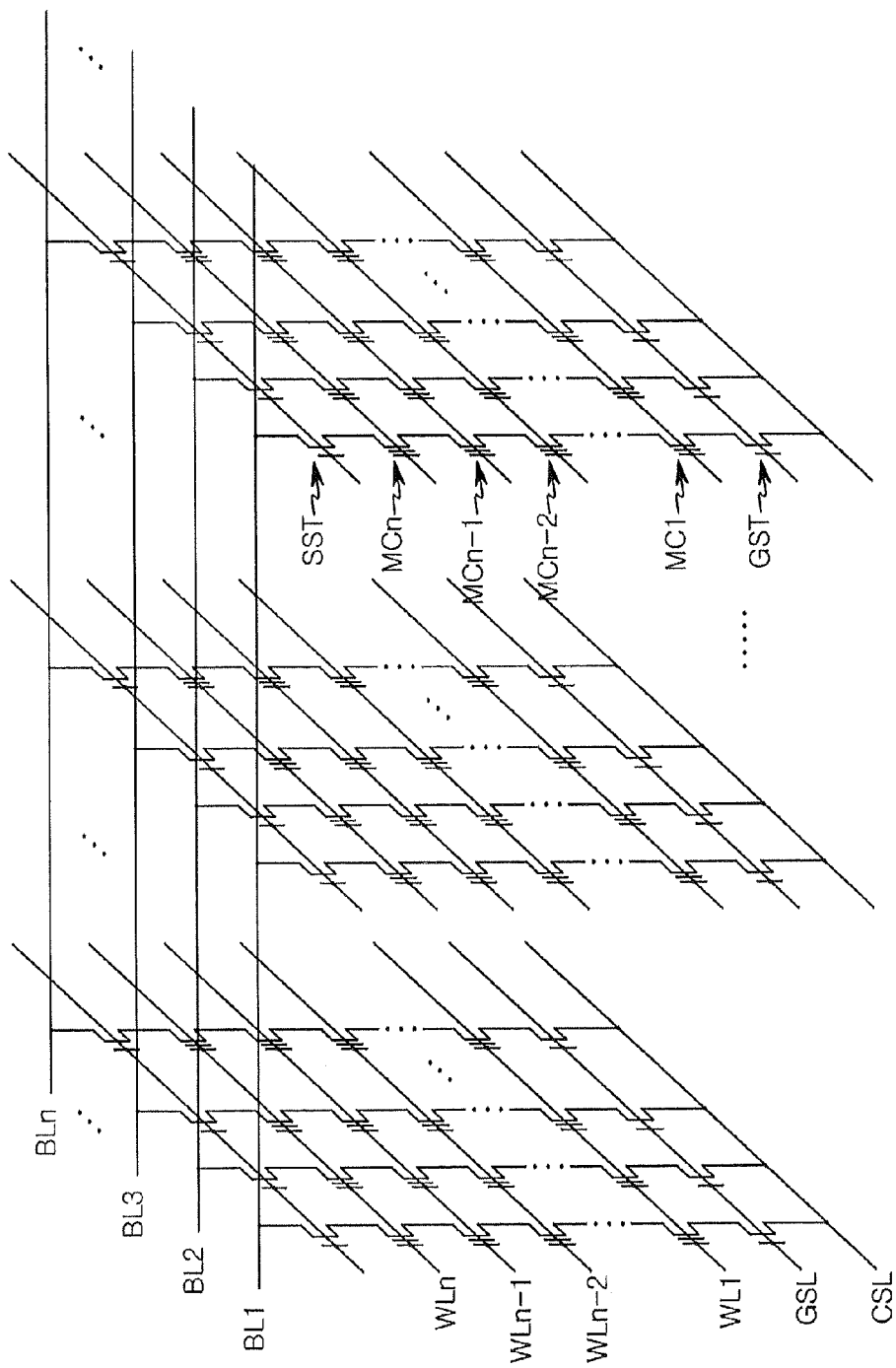
FIG. 19 is an equivalent circuit diagram of the semiconductor device (memory cell array) illustrated in FIG. 18.

FIG. 18 is a perspective view illustrating a semiconductor device (a non-volatile memory device) according to an example embodiment of the present disclosure; and FIG. 19 is an equivalent circuit diagram of the semiconductor device (a memory cell array) illustrated in FIG. 18.

Referring to FIG. 18, a non-volatile memory device 300 may include channel regions 360 disposed in a direction perpendicular to an upper surface of the substrate 301 and a plurality of interlayer insulating layers 320 and a plurality of gate electrodes 330 stacked along outer side walls of the channel regions 360. Also, the non-volatile memory device 300 may further include a gate insulating layer 340 disposed between the gate electrodes 330 and the channel regions 360, and may include a bit line 390 disposed on upper portions of the channel regions 360.

In the present example embodiment, a single memory cell string may be configured having each channel region 360 as a center, and a plurality of memory cell strings may be arranged in rows and columns in x and y directions.

The substrate 301 may have an upper surface extending in the x and y directions. The substrate 301 may include a semiconductor material, for example, Group IV semiconductor, Group III-V compound semiconductor, or Group II-VI oxide semiconductor. For example, Group IV semiconductor may include silicon, germanium, or silicon-germanium. The substrate 301 may be provided as a bulk wafer or an epitaxial layer.

The columnar channel regions 360 may each be disposed to extend in a direction perpendicular to an upper surface of the substrate 301. The channel regions 360 may have an annular shape surrounding a buried insulating layer 375 disposed therein, but according to an example embodiment, the channel regions 360 may have a columnar shape such as a cylindrical shape or a prismatic shape without the buried insulating layer 375 therein. Also, the channel regions 360 may have a sloped lateral surface becoming narrower toward the substrate 301 according to an aspect ratio.

The channel regions 360 may be disposed to be spaced apart from one another in the x and y directions. However, the channel regions 360 may be variously modified. For example, the channel regions 360 may be disposed in zigzags in at least one direction. Also, the adjacent channel regions 360 having an isolation insulating layer 385 interposed therebetween may be symmetrical, but the present disclosure is not limited thereto.

A lower surface of each channel region 360 may be in direct contact with the substrate 301 so as to be electrically connected thereto. The channel regions 360 may include a semiconductor material such as polysilicon or single crystalline silicon, and here, the semiconductor material may be an undoped material or a material including p-type or n-type impurity.

A plurality of gate electrodes 330 (specifically, 331 to 338) may be disposed to be spaced apart from one another in the z direction along the lateral surfaces of the channel regions 360 from the substrate 301.

Referring to FIG. 19 as well, each of the gate electrodes 330 may form a gate of each of the ground select transistor GST, a plurality of memory cells MC1 to MCn, and the string select transistors SST. The gate electrodes 330 may extend to form the word lines WL1 and WLn, and may be commonly connected in a predetermined unit of adjacent memory strings arranged in the x and y directions. In an example embodiment, six gate electrodes 332 to 337 of the memory cells MC1 to MCn are arranged, but this is merely illustrative and the number of the gate electrodes 332 to 337 constituting the memory cells MC1 to MCn may be determined according to capacity of the non-volatile memory device 300. For example, the number of gate electrodes 332 to 337 constituting the memory cells MC1 to MCn may be $2^n$ (n is a natural number).

The gate electrode 331 of the ground select transistor GST may extend in the y direction to form the ground select line GSL. The gate electrode 338 of the string select transistor SST may extend in the y direction to form the string select line SSL.

In particular, the gate electrode 338 of the string select transistor SST may be separated between the memory cell strings adjacent in the x direction to form different string select lines SSL. According to an example embodiment, the string select transistor SST may have two or more gate electrodes 338 and the ground select transistor GST may have two or more gate electrodes 331, and the two or more gate electrodes 338 and the two or more gate electrodes 331 may have a structure different from that of the gate electrodes 332 to 337 of the memory cells MC1 to MCn.

The gate electrodes 330 may be formed of the materials mentioned in the former example embodiment, and may include, for example, polysilicon or metal silicide material. The metal silicide material may be silicide material of a metal selected from among cobalt (Co), nickel (Ni), hafnium (Hf), platinum (Pt), tungsten (W), and titanium (Ti). According to an example embodiment, the gate electrodes 330 may include a metal, for example, tungsten (W). Also, although not shown, the gate electrodes 330 may further include a diffusion barrier, and the diffusion barrier may include, for example, at least one of tungsten nitride (WN), tantalum nitride (TaN), and titanium nitride (TiN).

The plurality of interlayer insulating layers 321 to 329 (320) may be arranged between the gate electrodes 330. Like the gate electrodes 330, the interlayer insulating layers 320 may be arranged to be spaced apart from one another in the z direction and extend in the y direction. However, an eighth interlayer insulating layer 328 and a ninth interlayer insulating layer 329 may be connected between the gate electrodes 338 of the string select transistor SST.

The interlayer insulating layers 320 may include an insulting material such as silicon oxide or silicon nitride.

In an upper end of the memory cell string, a drain region 365 may be disposed to cover an upper surface of the buried insulating layer 375 and be electrically connected to the channel regions 360. The drain region 365 may include doped polysilicon, for example. The drain region 365 may act as a drain region of the string select transistor SST (please refer to FIG. 19).

A conductive contact plug 380 may be disposed on an upper portion of the drain region 365 and be connected to the bit line 390. The contact plug 380 may be connected to the drain region 365 by penetrating through a portion of a ninth interlayer insulating layer 329, but a partial region of the ninth interlayer insulating layer 329 in a lateral surface of the contact plug 380 is omitted from the illustration in order to facilitate understanding.

The bit line 390 may extend to be connected to a row of drain regions 365 arranged in the x direction on upper portions of the drain regions 365.

Source regions 305 of the ground select transistors GST (please refer to FIG. 19) arranged in the x direction may be disposed in lower ends of the memory cell strings. The source regions 305 may be adjacent to the upper surface of the substrate 301, extend in the y direction, and be spaced apart from one another by a predetermined unit in the x direction. For example, one source region 305 may be arranged in every two channel regions 360 in the x direction, but the present disclosure is not limited thereto. The isolation insulating layer 385 may be formed on each source region 305.

In a case in which the source region 305 has a conductivity type opposite to that of the substrate 301, the source region 305 may act as a source region of adjacent ground select transistors GST and be connected to the common source line CSL of FIG. 19. In a case in which the source region 305 has the same conductivity type as that of the substrate 301, the source region 305 may act as a pocket P well contact for an erase operation of block units of the memory cell strings. In this case, as high voltage is applied to the substrate 301 through the pocket P well contact electrode, data stored in all of the memory cells within a corresponding memory cell block may be erased.

The gate insulating layer 340 may be disposed between the gate electrodes 330 and the channel regions 360. The gate insulating layer 340 may include a tunneling layer 342, an electric charge storage layer 344, and a blocking layer 346 sequentially stacked on the channel regions 360. The trap reduction technique described in the former example embodiments, namely, the trap reduction technique implemented with the heat treatment process after forming a germanium-containing curing layer, may be applied to the gate insulating layer 340. A germanium element diffused from the curing layer may be detected in the gate insulating layer 340 employing the trap reduction technique.

The tunneling layer 342 may tunnel electric charges to the electric charge storage layer in a Fowler-Nordheim (F-N)

manner. The tunneling layer may include, for example, a silicon oxide. The electric charge storage layer 344 may be an electric charge trap layer or a floating gate conductive layer. The blocking layer 346 may include a high-k dielectric material. Here, the high-k dielectric material refers to a dielectric material having a dielectric constant (for example, a dielectric constant higher than or equal to 10) higher than that of a silicon oxide film.

The trap reduction technique described in the former example embodiment may be applied to the entirety of the gate insulating layer 340 or may be selectively applied to a portion of the dielectric layer. In the present example embodiment, the blocking layer 346 of the gate insulating layer may mainly use a high k dielectric material and involves a concentration of a trap problem, and thus, the trap reduction technique may be selectively applied to the blocking layer 346. In a manufacturing method illustrated in FIGS. 20 through 28, a case in which the trap reduction technique is applied limitedly to the blocking layer 346 will be described.

FIGS. 20 through 28 are perspective views illustrating a major sequential process of a method of manufacturing a semiconductor device according to an example embodiment of the present disclosure.

Figure 20:
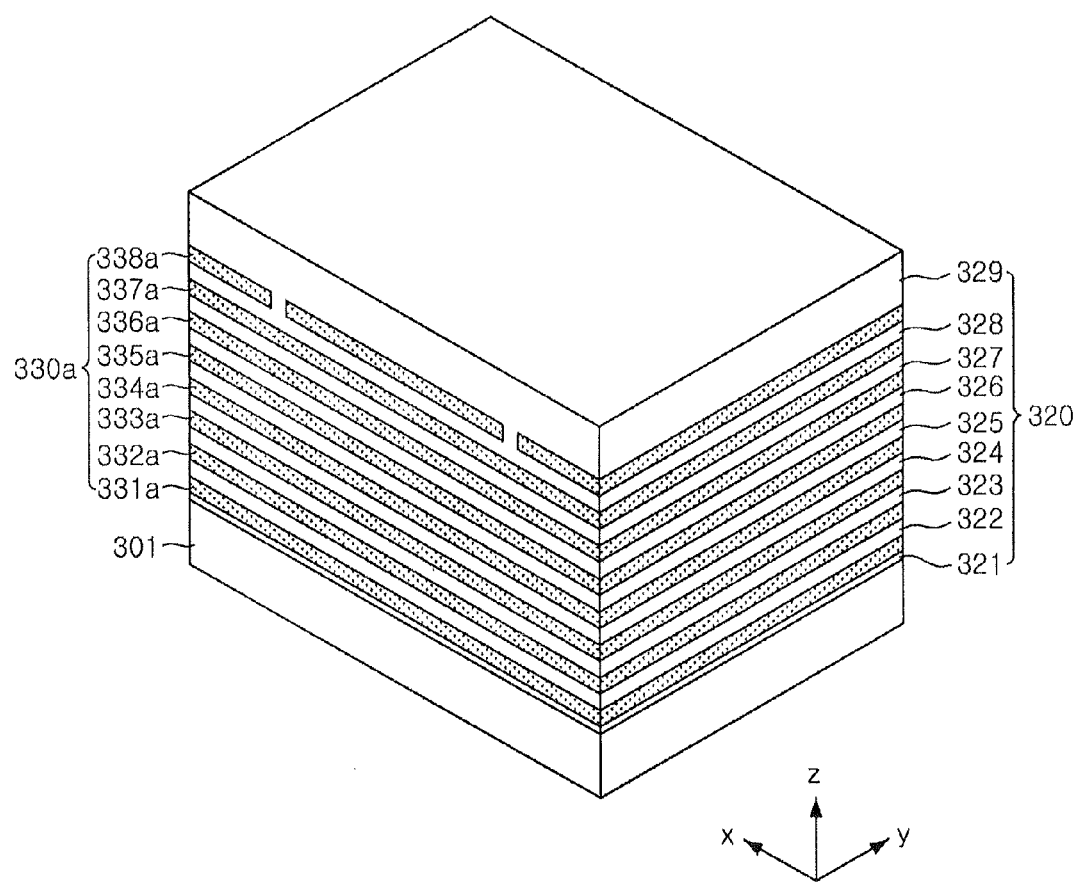
FIGS. 20 through 28 are perspective views illustrating a sequential process of a method of manufacturing a semiconductor device according to an example embodiment of the present disclosure.

Referring to FIG. 20, a plurality of interlayer insulating layers 320 and a plurality of conductive layers 331a to 338a (330a) may be alternately stacked on the substrate 301.

As illustrated, the interlayer insulating layers 320 and the conductive layers 330a may be alternately stacked on the substrate 301, starting from a first interlayer insulating layer 321. In particular, a ninth interlayer insulating layer 329 may be formed by removing a portion of an eighth conductive layer 338a disposed in the uppermost layer. The removed region may be a region between the channel regions 360 in FIG. 18, and may be a region extending in the y direction.

In this process, unlike the gate electrodes 330 of FIG. 18, the conductive layers 330a may be formed of polysilicon prior to formation of metal silicide. The interlayer insulating layers 320 may be, for example, at least one of silicon oxide films and silicon nitride films.

Thicknesses of the interlayer insulating layers 320 may not be uniform. A first interlayer insulating layer 321 in the lowermost portion among the interlayer insulating layers 320 may be formed to be relatively thin, and a ninth interlayer insulating layer 329 in the uppermost portion may be formed to be relatively thick. However, the number and thicknesses of the interlayer insulating layers 360 and the conductive layers 330a may be variously modified from those illustrated.

Figure 21:
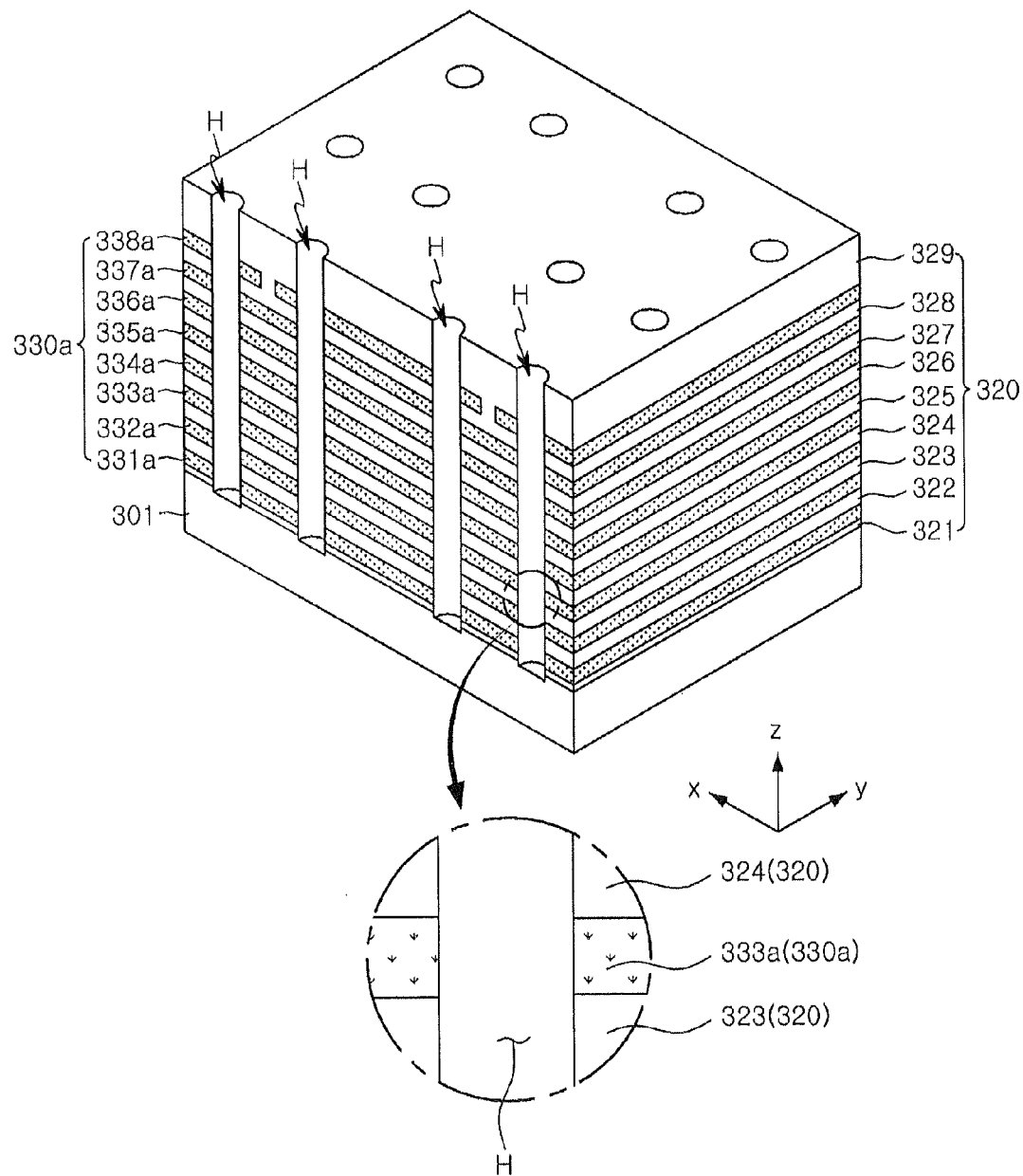

Referring to FIG. 21, openings H may be formed to penetrate the alternately stacked interlayer insulating layers 320 and conductive layers 330a.

The openings H may extend to the substrate 301 in the z direction and have a hole shape. Also, the openings H may be spaced apart from one another in the x and y directions and be formed in columns and rows. The openings H may have a prismatic shape according to an example embodiment.

The openings H may be formed by forming a mask pattern defining positions of the openings H on the alternately stacked interlayer insulating layers 320 and conductive layers 330a and anisotropic-etching the interlayer insulating layers 320 and the conductive layers 330a by using the mask pattern as an etching mask. Since a stacked structure including two types of different films is etched, side walls of the plurality of openings H may not be perpendicular to the upper surface of the substrate 301. For example, widths of the openings H may decrease toward the upper surface of the substrate 301.

The openings H may be formed to allow the upper surface of the substrate 301 to be exposed, and as illustrated, the openings H may be over-etched to render the upper surface of the 301, exposed by the openings H, to be recessed at a predetermined depth.

Figure 22:
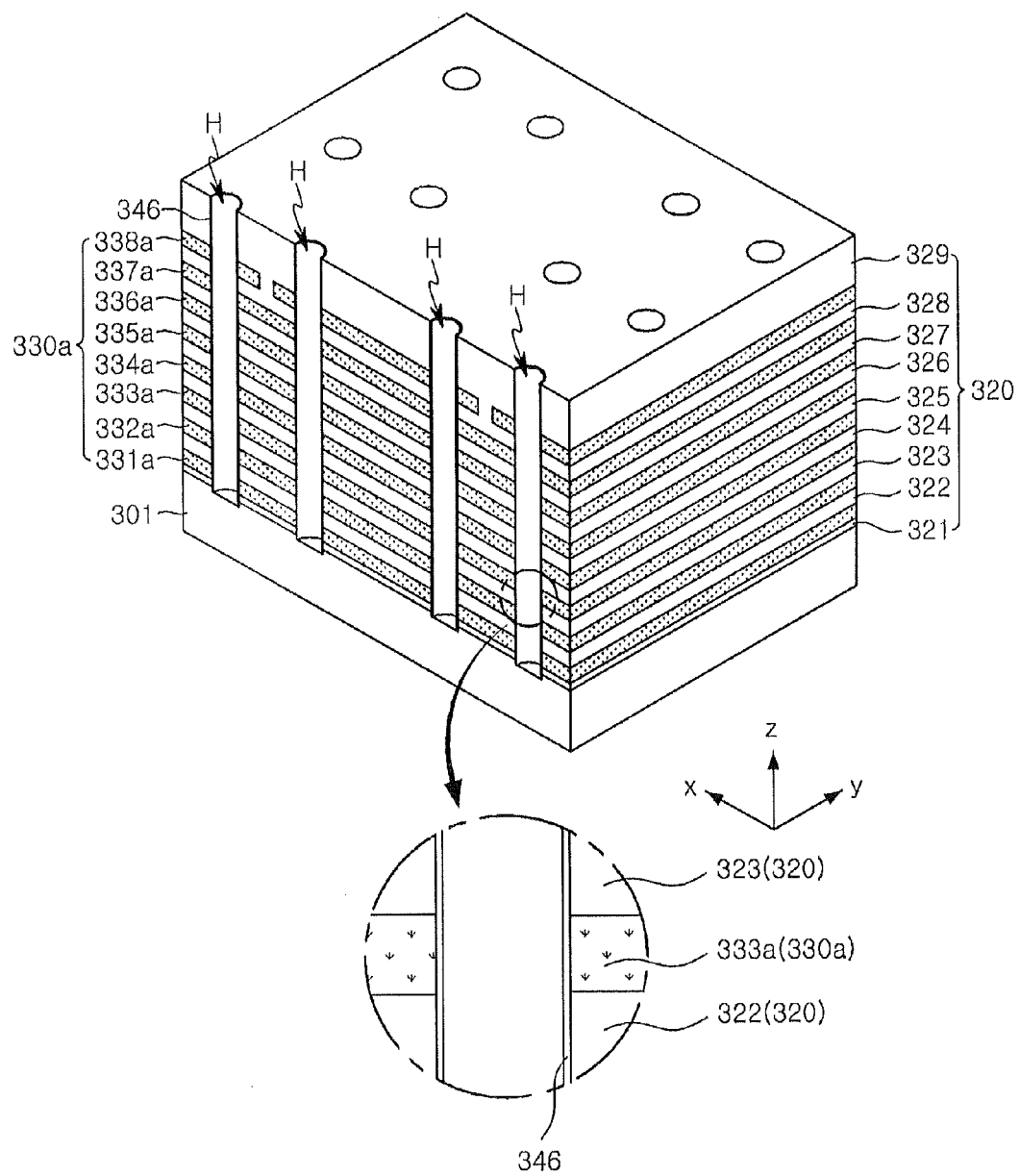

Referring to FIG. 22, the blocking layer 346 for the gate insulating layer may be formed on side walls of the openings H.

The blocking layer 346 may be formed through ALD or CVD. The blocking layer 346 may include a silicon oxide ($SiO_2$), a silicon nitride ($Si_3N_4$), a silicon oxy-nitride (SiON), or a high-k dielectric material. The high-k dielectric material may be at least one selected from the group consisting of a hafnium oxide film ($HfO_2$), a hafnium silicon oxide film (HfSiO), a hafnium silicon oxy-nitride film (HfSiON), a hafnium oxy-nitride film (HfON), a hafnium aluminum oxide film (HfAlO), a hafnium lanthanum oxide film (HfLaO), a zirconium oxide film ($ZrO_2$), a tantalum oxide film ($TaO_2$), a zirconium silicon oxide film (ZrSiO), a lanthanum oxide film ($La2O_3$), a praseodymium oxide film ($Pr_2O_3$), a dysprosium oxide film ($Dy_2O_3$), a barium strontium titanate (BST) oxide film ($Ba_xSr_{1-x}TiO_3$) and a lead zirconate titanate (PZT) oxide film ($Pb(Zr_xTi_{1-x})O_3$). Since the high-k dielectric material is mainly used as a material of the blocking layer 346, a defect may easily occur due to chemical instability resulting from diffusion of a transition element. Thus, in the present example embodiment, the blocking layer 346 may be selectively cured before any other elements (tunneling layer, an electric charge trap layer, or the like) of the gate insulating layer 340 are formed.

Figure 23:
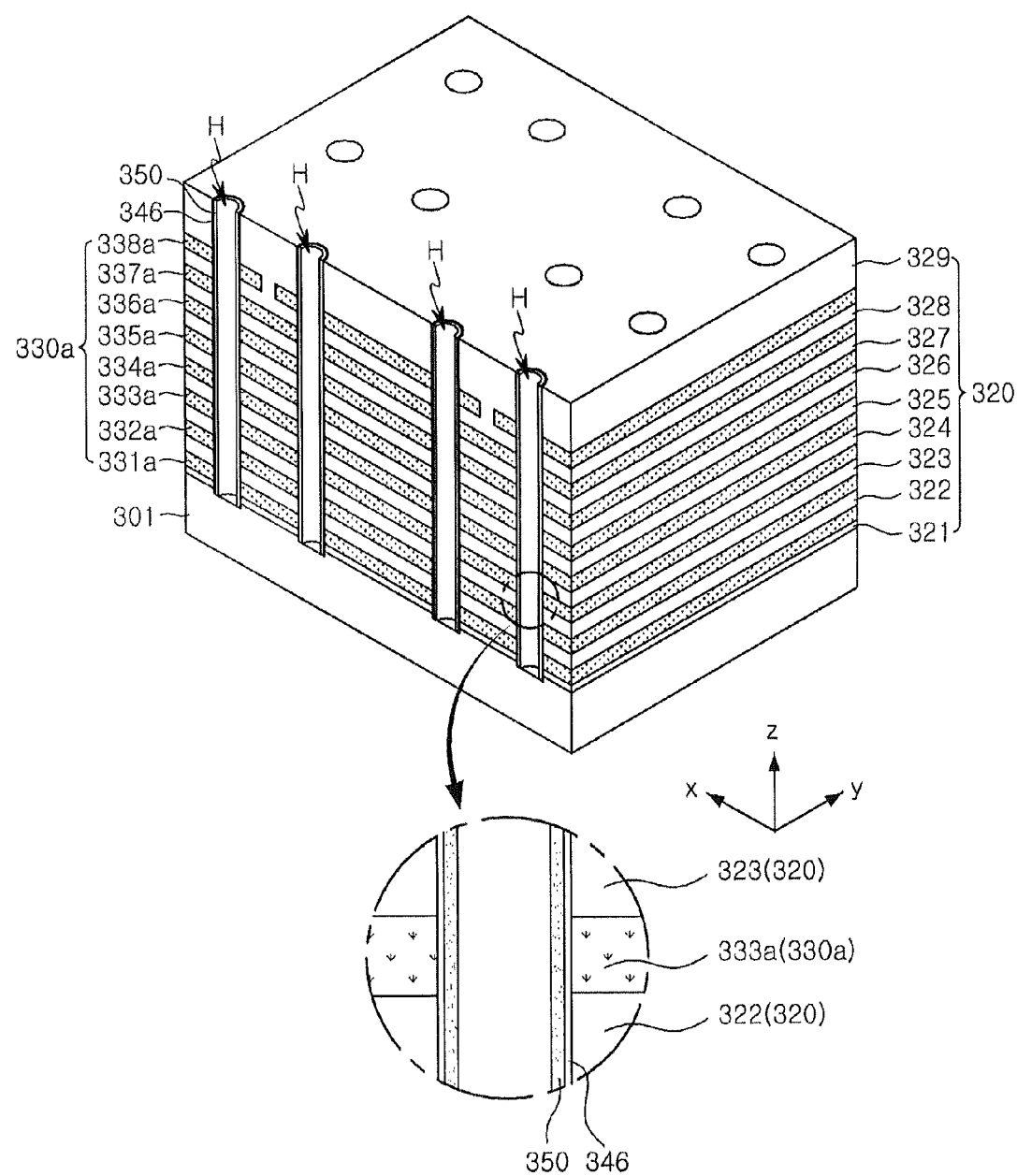

Referring to FIG. 23, a curing layer 350 formed of a material containing germanium (Ge) may be formed on the blocking layer 346.

The germanium-containing material may include metal germanium or silicon germanium (SiGe). In the case in which silicon germanium (SiGe) is used, the content of germanium (Ge) may be at least 10%. The curing layer 350 may be doped with a specific conductivity-type impurity. For example, the curing layer 350 formed of silicon germanium (SiGe) may be doped with at least one of boron (B), arsenic (As), and phosphorous (P). The curing layer 350 may be formed to have a thickness ranging from tens of Å to hundreds of Å. For example, a thickness of the curing layer 350 may range from 50 Å to 800 Å.

The heat treatment process may be performed at a temperature ranging from 500° C. to 1,300° C. The heat treatment process may be performed within a duration ranging from 5 seconds to 200 seconds, but the present disclosure is not limited thereto. In order to guarantee effective germanium diffusion, the heat treatment may be performed at a temperature ranging from 750° C. to 1,000° C.

During the heat treatment process, the germanium element of the curing layer 350 may be diffused to the blocking layer 346. By diffusing the germanium element to the blocking layer 346, traps positioned in the blocking layer 346 may be effectively cured. As a result, the germanium element may be detected in the blocking layer 346 in a final semiconductor device.

Figure 24:
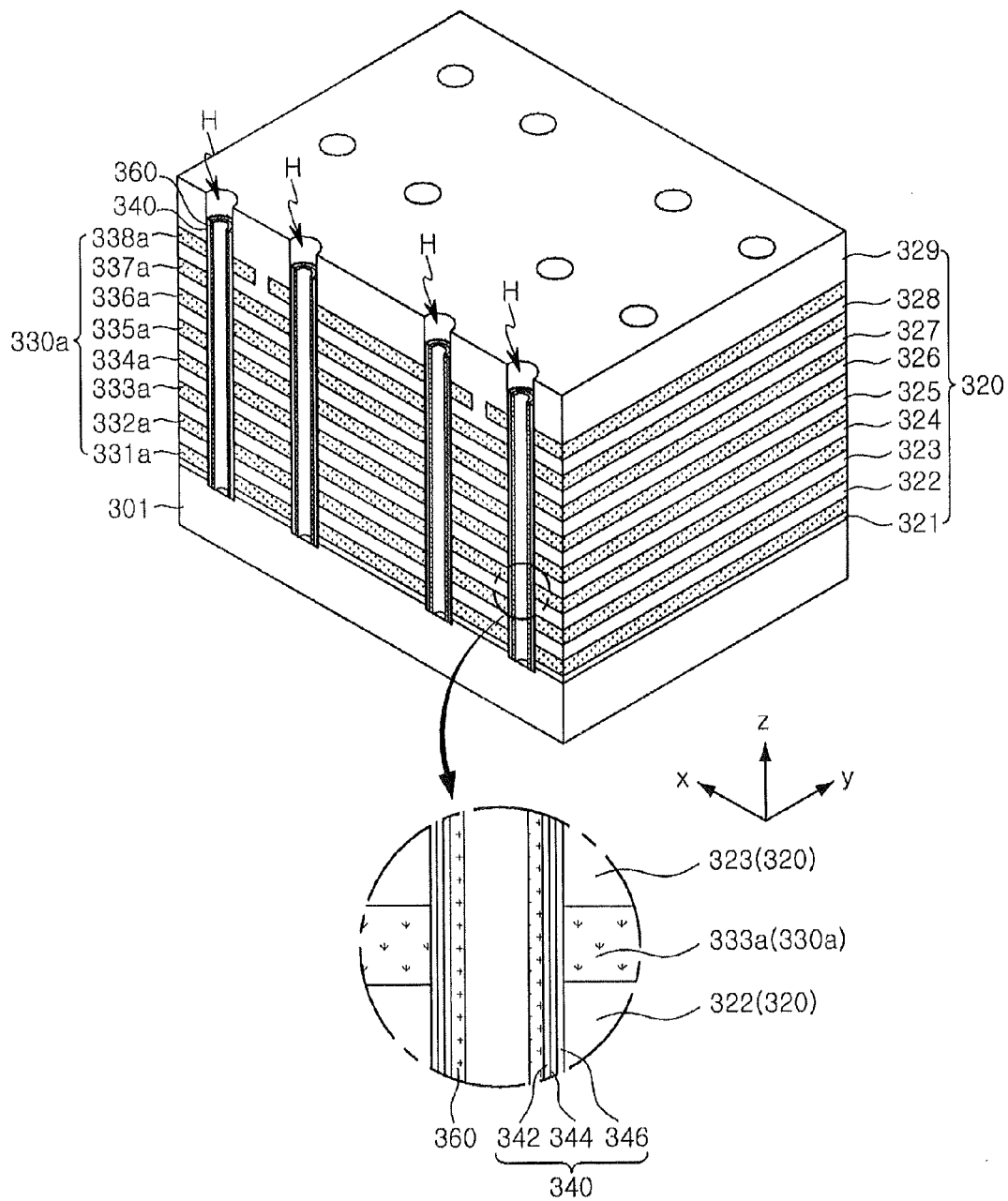

Referring to FIG. 24, the curing layer 350 may be removed from the cured blocking layer 346, and the dielectric layers 342 and 344 and the channel regions 360 may be formed on the blocking layer 346 in the openings H.

Here, the curing layer 350 may be removed through a dry or wet etching process. In the present example embodiment, a configuration in which a protective capping layer such as TiN is not employed is illustrated; however, in FIG. 23, before the curing layer 350 is formed, a protective capping layer may be formed on the blocking layer 346, and when the curing layer 350 is removed, the protective capping layer may also be removed.

As illustrated in FIG. 18, the gate insulating layer 340 may have a structure in which the blocking layer 346, the electric charge storage layer 344, and the tunneling layer 342 are sequentially stacked. In forming the gate insulating layer 340, layers formed on an upper surface of the substrate 301 in a lower portion of the openings H may be removed by using a process such as etchback to expose the substrate 301. Here, the gate insulating layer 340 formed in an upper region of the openings H may also be partially removed.

Thereafter, each channel region 360 may be formed on the gate insulating layer 340. The channel regions 360 may be in direct contact with the substrate 301 in a lower portion of the openings H. A part of the channel regions 360 formed on the substrate 301 in a lower portion of the openings H may be removed through an etch-back process. Thus, as illustrated, each channel region 360 may be partially removed even in the upper portion of the openings H, and a height of each channel region 360 may not be limited to the height illustrated in FIG. 24 and may vary within a range higher than that of the eighth conductive layer 338a.

Figure 25:
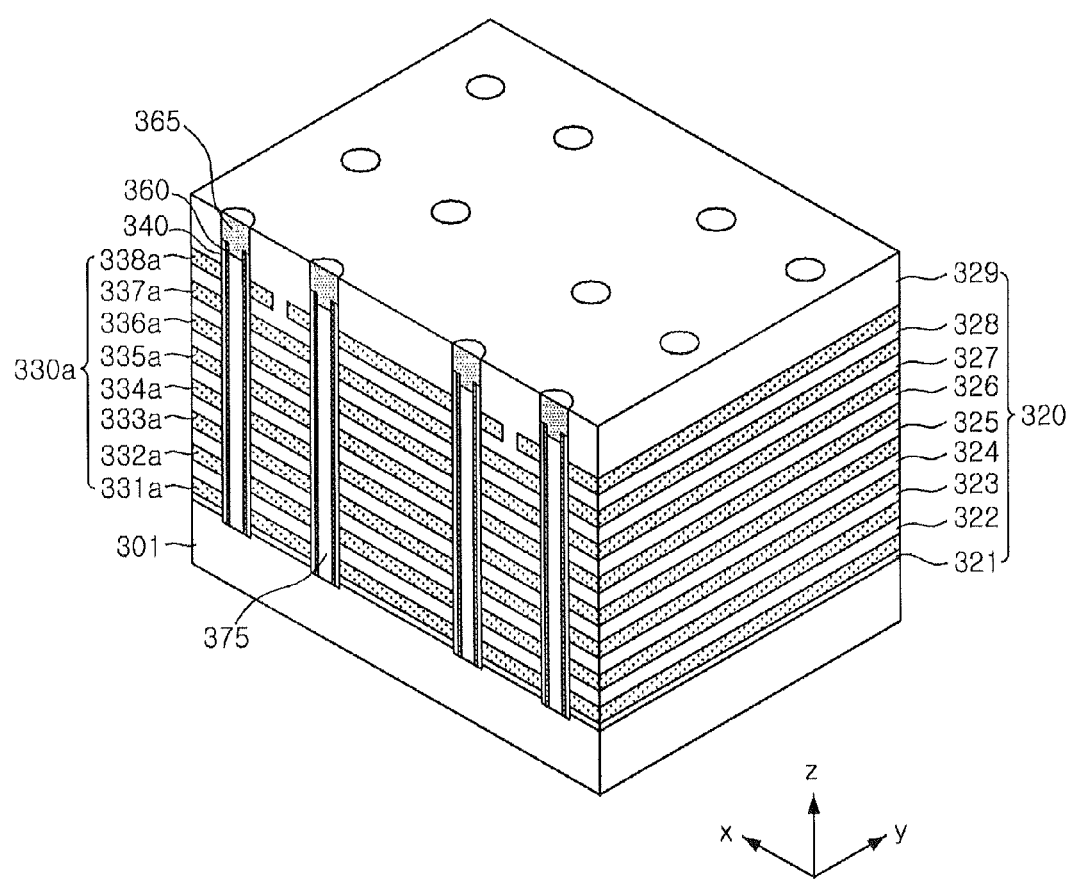

Referring to FIG. 25, a buried insulating layer 375 burying the openings H may be formed, and a drain region 365 may be formed on the buried insulating layer 375.

The buried insulating layer 375 may be formed to fill up to a portion of the height of the ninth interlayer insulating layer 329, rather than filling up to the upper surface of the ninth interlayer insulating layer 329. To this end, an etch-back process may be additionally performed after depositing the buried insulating layer 375.

The drain region 365 may be formed on the buried insulating layer 375 to be connected to each channel region 360 in an upper portion of the buried insulating layer 375. After a conductive material for forming the drain region 365 is deposited in an upper portion of the buried insulating layer 375, a planarization process may be performed thereon to remove a material of each channel region 360 and the conductive material (not shown) covering the ninth interlayer insulating layer 329 in the uppermost portion. Accordingly, the drain region 365 may be formed in the upper portion of the buried insulating layer 375. According to an example embodiment, the drain region 365 may include the material of the channel regions 360 formed to be contiguous with the ninth interlayer insulating layer 329. A height of the drain region 365 is not limited to that illustrated and may vary according to an example embodiment.

Figure 26:
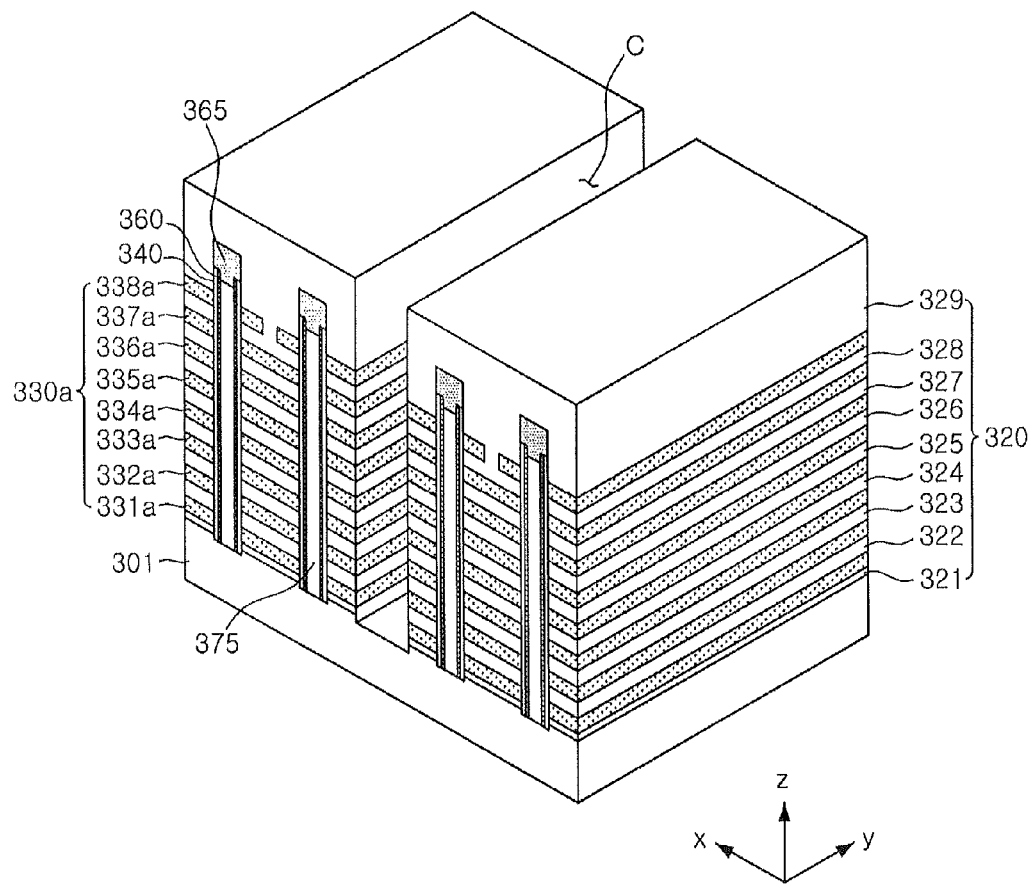

Referring to FIG. 26, an isolation opening C may be formed to separate the conductive layers 330a by a predetermined interval to expose the substrate 301 between the channel regions 360. The isolation opening C may have a line shape extending in the y direction, and at least one isolation opening C may be formed in each channel region 360 in the x direction between the channel regions 360. Before the formation of the isolation opening C, an additional insulating layer may be formed on the ninth interlayer insulating layer 329 and the drain region 365 in order to increase a thickness of the ninth interlayer insulating layer 329. This is to prevent damage to the drain region 365, the channel regions 360 therebelow, and the like, during formation of the isolation opening C.

The isolation opening C may be formed by forming a mask layer by using a photolithography process and anisotropic-etching the interlayer insulating layers 320 and the conductive layers 330a. A source region 305 constituting the common source line CSL (please refer to FIG. 19) is formed on the substrate 301 exposed by the isolation opening C in a follow-up process.

Figure 27:
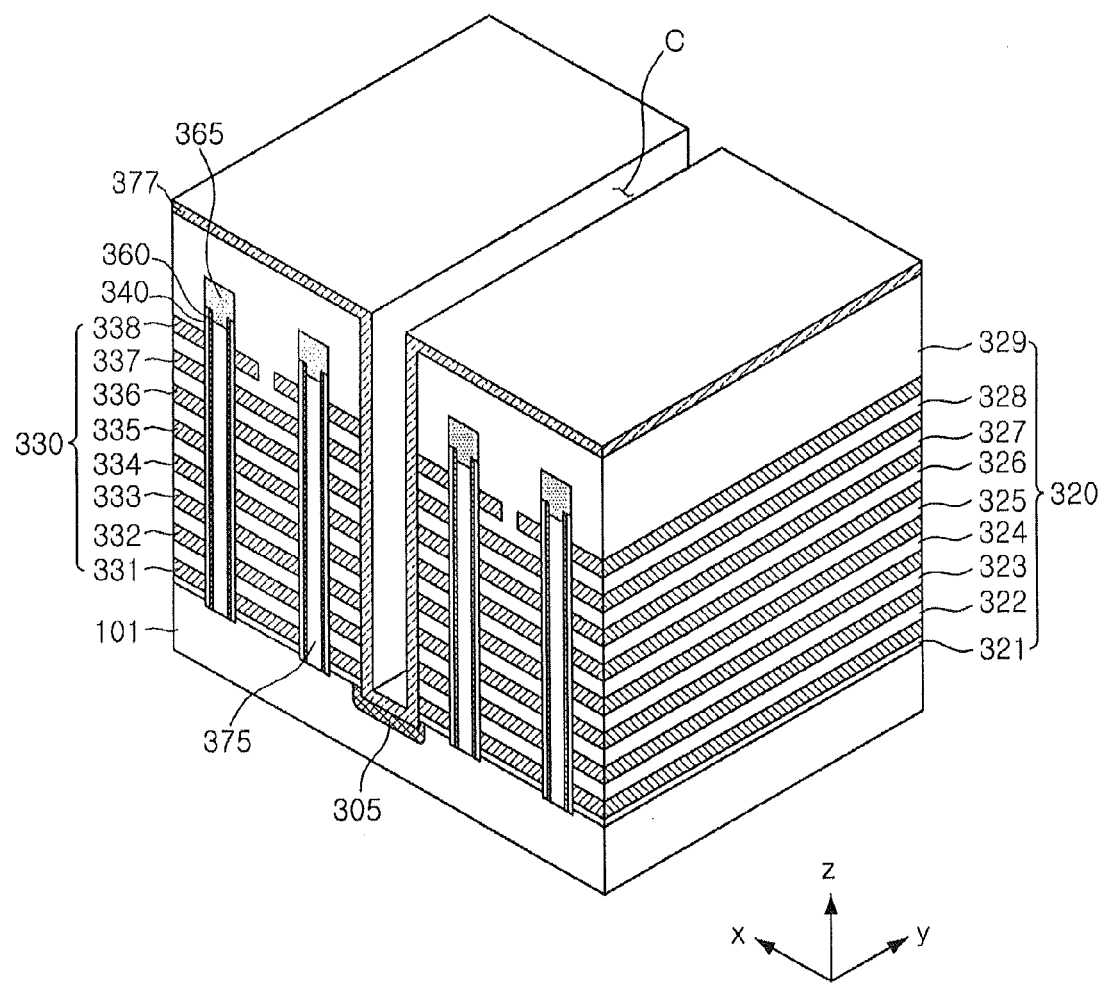

Referring to FIG. 27, a process of forming a metal layer 377 within the isolation opening C may be performed.

The metal layer 377 may be a material for rendering the polysilicon conductive layers 330a to become metal silicide. After the formation of the metal layer 377, a heat treatment process may be performed to allow metals of the metal layer 377 to spread to make the conductive layers 330a become silicide such that the gate electrode 330 is formed, thereby reducing resistance. Thereafter, remaining metal layers 377 may be removed.

In this process, the substrate 301 exposed from the lower portion of the isolation opening C may also become silicide in a predetermined depth and form the source region 305. According to an example embodiment, an ion implantation process may be additionally performed to form a doped region around the silicide source region 305. Also, in a modified embodiment, the source region 305 may be formed as a doped region to form a PN junction with the underlying substrate 301 region through ion implantation, rather than becoming silicide. In this case, the source region 305 may be configured to include a high concentration region and low concentration region disposed at both ends thereof.

Figure 28:
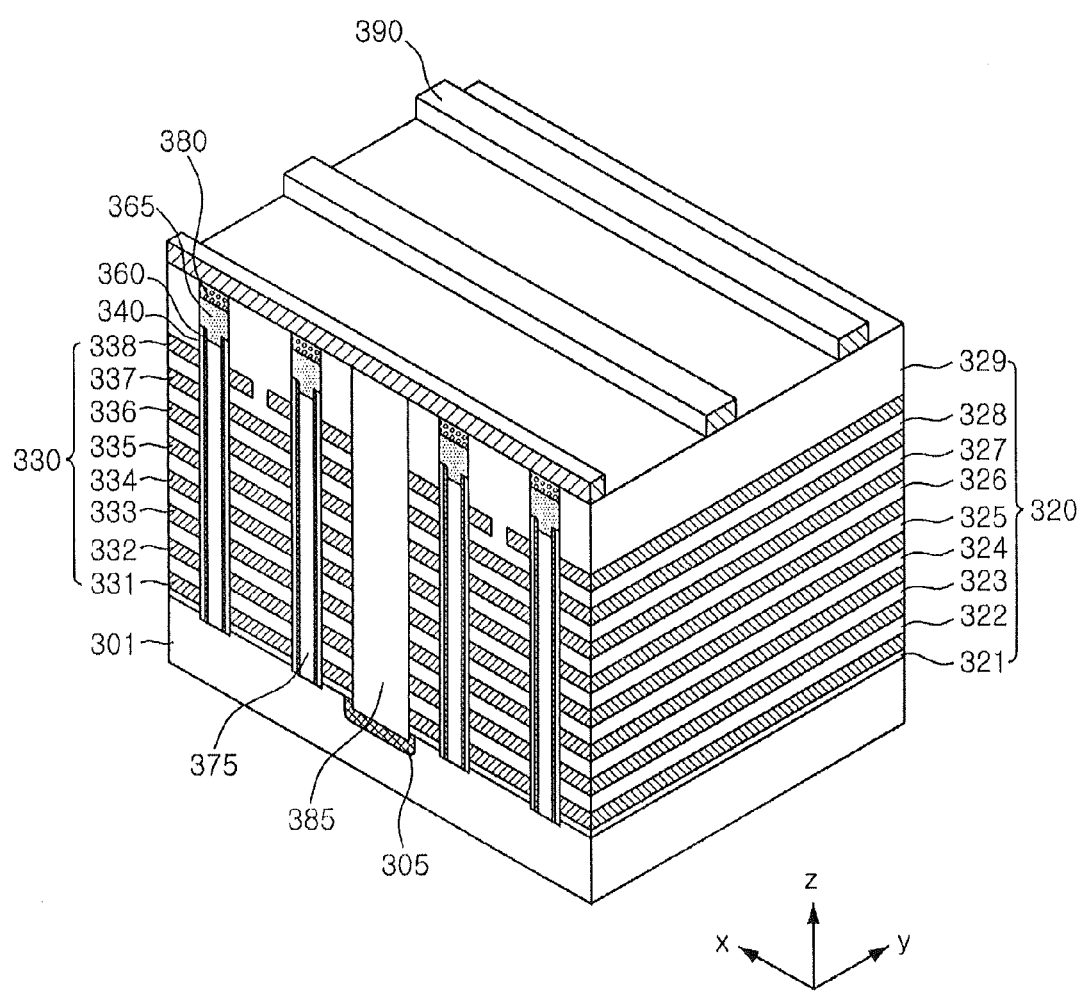

Referring to FIG. 28, an isolation insulating layer 385 may be formed on the source region 305, and a contact plug 380 connected to the drain region 365 and a bit line 390 may be formed.

The contact plug 380 may be formed of a conductive material and may be formed to be connected to the drain region 365 through the ninth interlayer insulating layer 329. However, according to an example embodiment, the formation of the contact plug 380 may be omitted or may be integrated with the drain region 365.

The bit line 390 may be formed on the ninth interlayer insulating layer 329 to connect the drain regions 365 and the contact plugs 380 arranged in the x direction. The bit line 390 may be formed in a line shape through a conductive material deposition process, and a mask forming process and an etching process based on photolithography.

Figure 29:
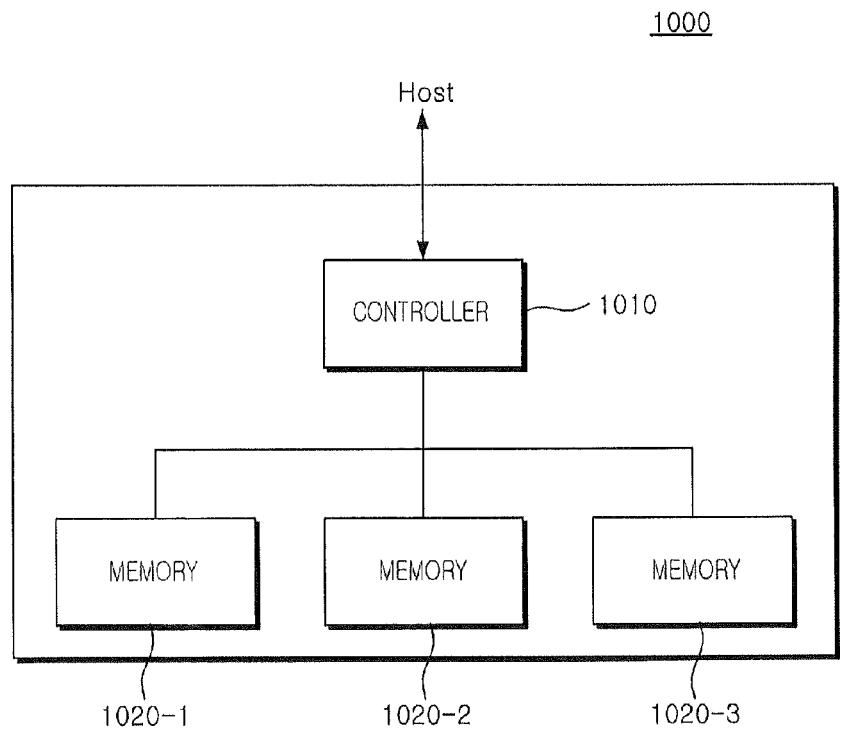
FIG. 29 is a block diagram illustrating a storage device including a semiconductor memory device according to an example embodiment of the present disclosure.

FIG. 29 is a block diagram illustrating a storage device including a semiconductor memory device according to an example embodiment of the present disclosure.

Referring to FIG. 29, a storage device 1000 may include a controller 1010 communicating with a host HOST and memories 1020-1, 1020-2, and 1020-3 storing data. Each of the memories 1020-1, 1020-2, and 1020-3 may include the non-volatile memory devices as described above.

The host HOST communicating with the controller 1010 may be various electronic devices in which the storage device 100 is installed. For example, the host HOST may be a smartphone, a digital camera, a desktop computer, a laptop computer, a media player, or the like. When a data write or read request is received from the host HOST, the controller 1010 may store data in the memories 1020-1, 1020-2, and 1020-3 or generate a command CMD to retrieve data from the memories 1020-1, 1020-2, and 1020-3.

As illustrated in FIG. 29, one or more memories 1020-1, 1020-2, and 1020-3 may be connected to the controller 1010 in parallel within the storage device 1000. By connecting the plurality of memories 1020-1, 1020-2, and 1020-3 to the controller 1010 in parallel, the storage device 1000 having large capacity, such as a solid state drive (SSD), may be implemented.

Figure 30:
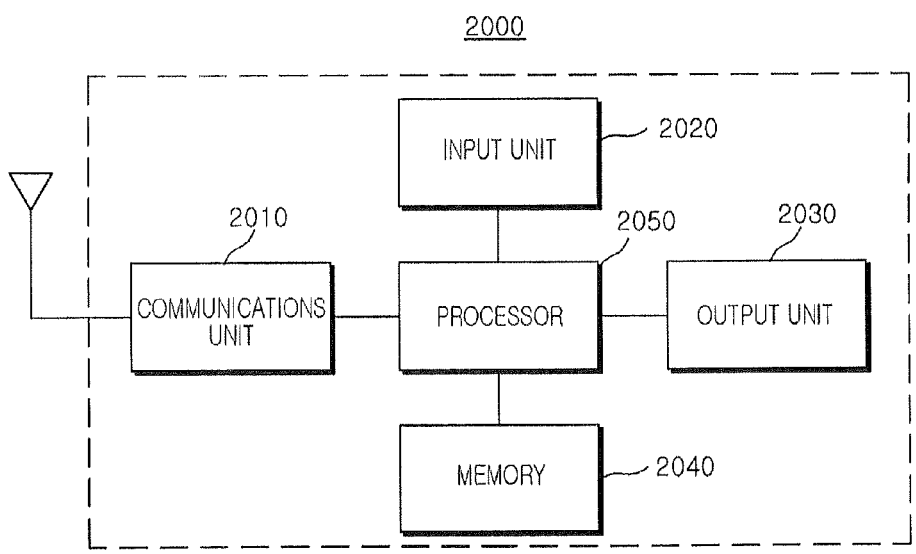
FIG. 30 is a block diagram illustrating an electronic device including a semiconductor memory device according to an example embodiment of the present disclosure.

FIG. 30 is a block diagram illustrating an electronic device including a non-volatile memory device according to an example embodiment of the present disclosure.

Referring to FIG. 30, an electronic device 2000 according to the present example embodiment may include a communications unit 2010, an input unit 2020, an output unit 2030, a memory 2040, and a processor 2050.

The communications unit 2010 may include a wired/wireless communications module, and may include a wireless Internet module, a short-range communications module, a global positioning system (GPS) module, a mobile communications module, and the like. A wired/wireless communications module included in the communications unit 2010 may be connected to an external communication network based on various communication standards to transmit and receive data.

The input unit 2010, provided to allow a user to control an operation of the electronic device 2000, may include a mechanical switch, a touchscreen, a voice recognition module, and the like. Also, the input unit 2010 may include a mouse operating in a track ball or a laser pointer manner, or the like, or a finger mouse device. In addition, the input unit 2020 may further include various sensor modules allowing the user to input data.

The output unit 2030 outputs information processed in the electronic device 2000 in an audio or video format, and the memory 2040 may store a program for processing and controlling the processor 2050, data, or the like. The memory 2040 may include one or more non-volatile memory devices according to the example embodiments of the present disclosure as described above. The processor 2050 may deliver a command to the memory 2040 according to a necessary operation in order to store data to the memory 2040 or retrieve data therefrom.

The memory 2040 may be installed in the electronic device 2000 or communicate with the processor 2050 through a separate interface. In the case in which the memory 240 communicates with the processor 2050 through a separate interface, the processor 2050 may store data to the memory 2040 or retrieve data therefrom through various interface standards such as SD, SDHC, SDXC, MICRO SD, USB, or the like.

The processor 2050 controls operations of respective components included in the electronic device 2000. The processor 2050 may perform controlling and processing related to an audio call, a video call, data communication, and the like, or may perform controlling and processing for multimedia playback and management. Also, the processor 2050 may process an input delivered from the user through the input unit 2020 and output corresponding results through the output unit 2030. Further, the processor 2050 may store data required for controlling an operation of the electronic device 2000 to the memory 2040 or retrieve such data therefrom.

As set forth above, according to example embodiments of the present disclosure, a defect of a dielectric layer and/or an interface defect between the dielectric layer and an active region may be effectively cured by using a germanium-containing curing layer and a heat treatment process. Thus, reliability of a semiconductor device may be significantly improved.

For example, a gate leakage current may be reduced and, in addition, reliability items of a semiconductor device related to a dielectric defect may be drastically improved to secure excellent electrical properties of a semiconductor device.

While example embodiments have been shown and described above, it will be apparent to those skilled in the art that modifications and variations could be made without departing from the spirit and scope of the present disclosure as defined by the appended claims.

What is claimed is:

1. A method of manufacturing a semiconductor device, the method comprising:
preparing a semiconductor substrate having an active region;
forming a dielectric layer on the active region;
forming a curing layer with a germanium (Ge)-containing material on the dielectric layer;
heat-treating the curing layer; and
removing the curing layer,
wherein the germanium (Ge) element exists in the interior of the dielectric layer and interface between the dielectric layer and the active region after removing the curing layer, and
wherein the method further comprises forming a protective capping layer on the dielectric layer before the forming of the curing layer.

2. The method of claim 1, wherein the germanium-containing material is silicon germanium (SiGe) or germanium (Ge).

3. The method of claim 2, wherein the germanium-containing material is SiGe doped with a specific conductivity-type impurity.

4. The method of claim 1, wherein the heat treating is performed at a temperature ranging from 500° C. to 1,300° C.

5. The method of claim 1, wherein, in removing the curing layer, at least a portion of the protective capping layer is removed.

6. The method of claim 1, wherein the protective capping layer is a first electrode layer for a gate electrode.

7. The method of claim 1, further comprising forming a second electrode layer on the first electrode layer after the removing of the curing layer.

8. The method of claim 7, wherein at least one of the first and second electrode layers comprises at least one material selected from the group consisting of polysilicon (poly-Si), titanium (Ti), TiN, tungsten (W), WSi, WN, TaN, lanthanum (La), aluminum (Al), and TiAlC.

9. The method of claim 1, further comprising forming a gate electrode on the dielectric layer after the removing of the curing layer.

10. The method of claim 1, wherein the dielectric layer comprises at least one material selected from the group consisting of a hafnium oxide film ($HfO_2$), a hafnium silicon oxide film (HfSiO), a hafnium silicon oxy-nitride film (HfSiON), a hafnium oxy-nitride film (HfON), a hafnium aluminum oxide film (HfAlO), a hafnium lanthanum oxide film (HfLaO), a zirconium oxide film ($ZrO_2$), a tantalum oxide film ($TaO_2$), a zirconium silicon oxide film (ZrSiO), a lanthanum oxide film ($La2O_3$), a praseodymium oxide film ($Pr_2O_3$), a dysprosium oxide film ($Dy_2O_3$), a barium strontium titanate (BST) oxide film ($Ba_xSr_{1-x}TiO_3$), and a lead zirconate titanate (PZT) oxide film ($Pb(Zr_xTi_{1-x})O_3$).

11. A method of manufacturing a semiconductor device, the method comprising:
forming a dielectric layer on a semiconductor substrate having an active region thereon;
forming a protective capping layer on the dielectric layer;

subsequently forming a curing layer with silicon germanium (SiGe) or germanium (Ge) on the protective capping layer on the dielectric layer;
heat-treating the curing layer; and
removing the curing layer.

* * * * *